(12) United States Patent
Watanabe

(10) Patent No.: US 11,277,125 B2
(45) Date of Patent: Mar. 15, 2022

(54) DRIVE CIRCUIT FOR DRIVEN SWITCHES

(71) Applicant: DENSO CORPORATION, Kariya (JP)

(72) Inventor: Kazunori Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 47 days.

(21) Appl. No.: 16/932,143

(22) Filed: Jul. 17, 2020

(65) Prior Publication Data

US 2020/0350907 A1 Nov. 5, 2020

Related U.S. Application Data

(63) Continuation of application No. PCT/JP2019/000669, filed on Jan. 11, 2019.

(30) Foreign Application Priority Data

Jan. 18, 2018 (JP) .............................. JP2018-006774

(51) Int. Cl.
*H03K 17/30* (2006.01)
*H02M 3/07* (2006.01)
*H03K 17/567* (2006.01)
*H03K 17/687* (2006.01)

(52) U.S. Cl.
CPC .............. *H03K 17/30* (2013.01); *H02M 3/07* (2013.01); *H03K 17/567* (2013.01); *H03K 17/687* (2013.01)

(58) Field of Classification Search
None
See application file for complete search history.

(56) References Cited

U.S. PATENT DOCUMENTS

| 2017/0019097 A1 | 1/2017 | Sato |
| 2018/0083610 A1 | 3/2018 | Ishii et al. |
| 2019/0243715 A1* | 8/2019 | Dewa .................. G06F 11/1443 |

FOREIGN PATENT DOCUMENTS

| JP | 2002-16486 A | 1/2002 |
| JP | 2012-227825 A | 11/2012 |
| JP | 2014-75896 A | 4/2014 |
| WO | 2012/165649 A1 | 12/2012 |

OTHER PUBLICATIONS

Apr. 9, 2019 Search Report issued in International Patent Application No. PCT/JP2019/000669.

* cited by examiner

*Primary Examiner* — Cassandra F Cox
(74) *Attorney, Agent, or Firm* — Oliff PLC

(57) ABSTRACT

A drive circuit drives driven switches connected in parallel with one another. The driven switches each include first, second main, and main control terminals. When a potential difference of the main control terminal with respect to the second main terminal becomes greater than or equal to a threshold voltage, the flow of current between the first and second main terminals is permitted. At least two driven switches have different threshold voltages. The drive circuit includes, for each driven switch, an electrical path electrically connecting the second main terminal or a negative voltage supply, which is at a negative voltage lower than the potential of the second main terminal, to the main control terminal. The impedance of each of the electrical paths is set so the potential difference increased by electric charge flowing into the electrical path through a parasitic capacitance of the driven switch becomes less than the threshold voltage.

10 Claims, 21 Drawing Sheets

(※Vth2>Vth1)

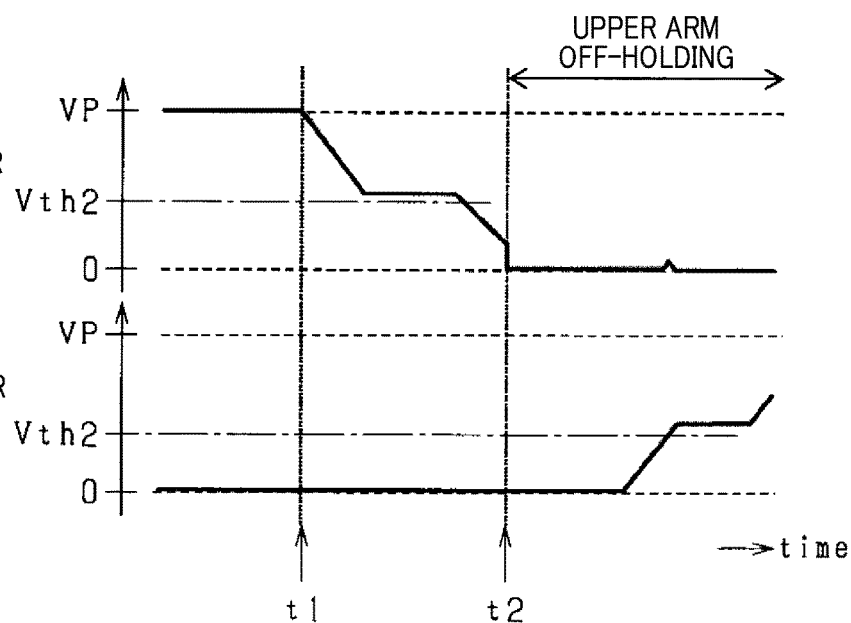

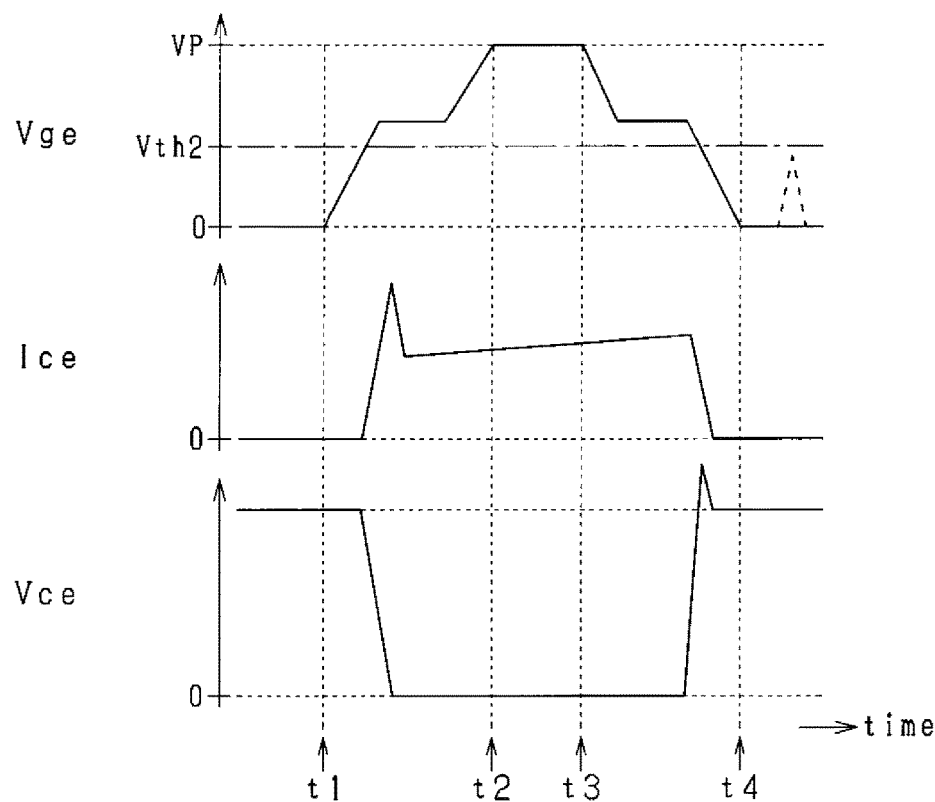
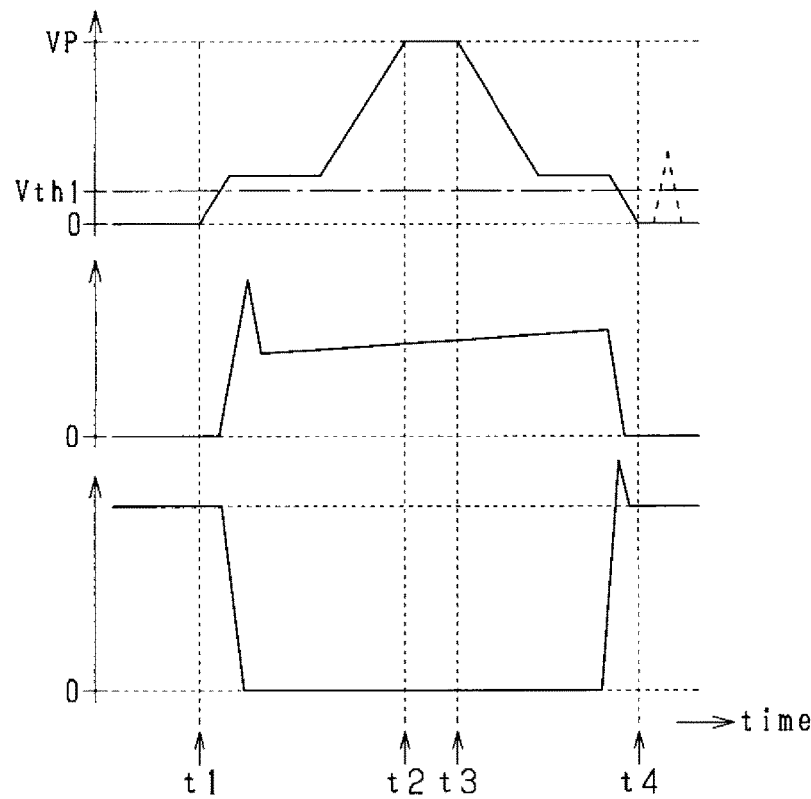

FIG.10
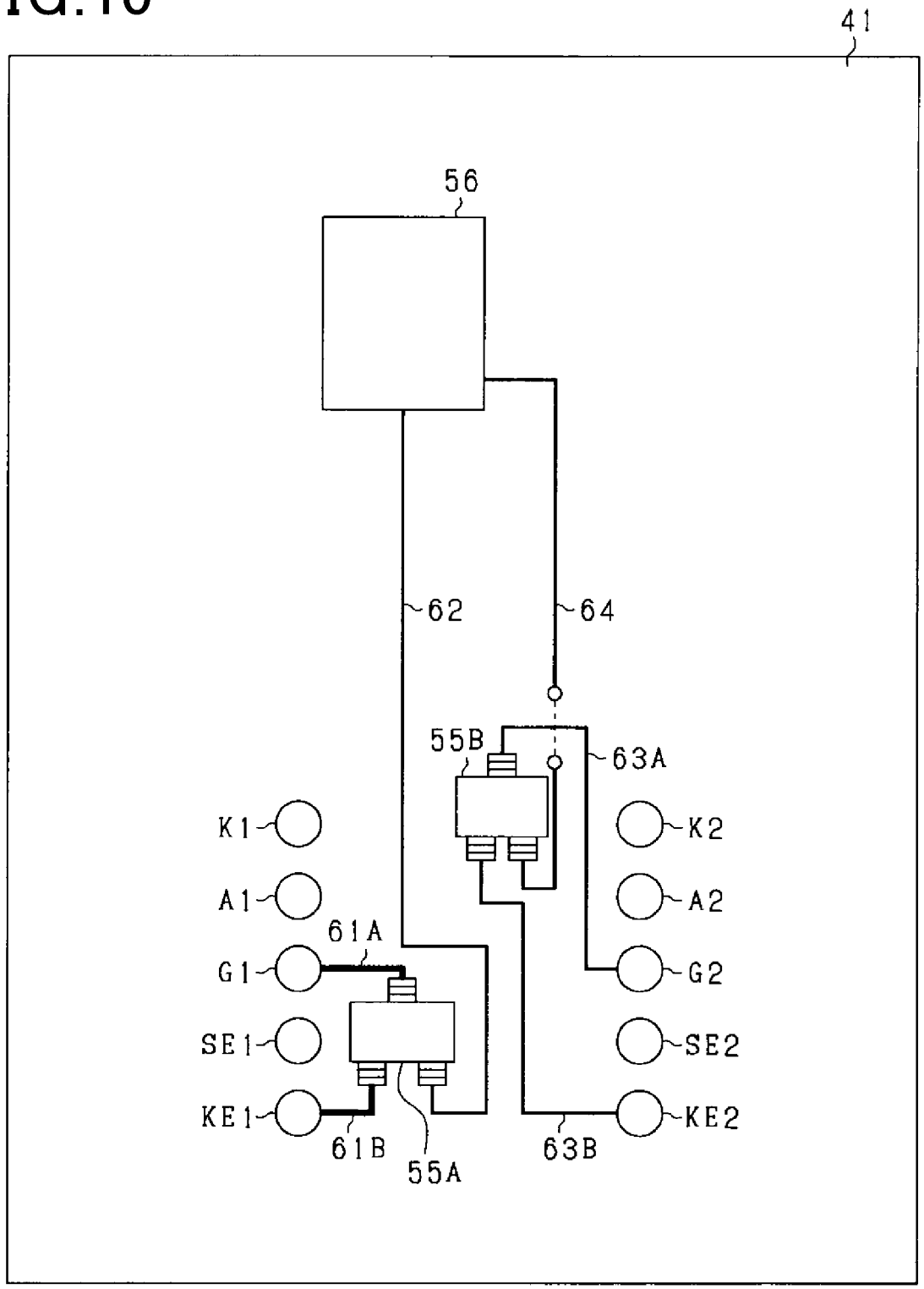
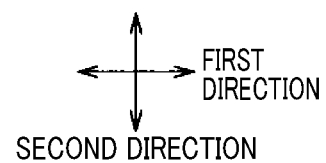

(※RonA<RonB)

FIG. 19(a) SW1 (MOS)

FIG. 19(b) SW2 (IGBT)

DRIVE CIRCUIT FOR DRIVEN SWITCHES

CROSS-REFERENCE TO RELATED APPLICATION

This application is the U.S. bypass application of International Application No. PCT/JP2019/000669, filed Jan. 11, 2019 which designated the U.S. and claims priority to Japanese Patent Application No. 2018-006774, filed Jan. 18, 2018, the contents of both of which are incorporated herein by reference.

TECHNICAL FIELD

The present disclosure relates to a drive circuit for driven switches.

BACKGROUND

Conventionally, switches, such as MOSFETs or IGBTs, each including a first main terminal, a second main terminal, and a main control terminal have been proposed as disclosed in JP 2002-16486 A, for example. Such a switch is brought into an on state when the potential difference of the main control terminal with respect to the second main terminal becomes greater than or equal to a threshold voltage. When the switch is in the on state, a current is permitted to flow between the first main terminal and the second main terminal. When the potential difference becomes less than the threshold voltage, the switch is brought into an off state. When the switch is in the off state, a current is prevented from flowing from the first main terminal to the second main terminal.

SUMMARY

The present disclosure provides a drive circuit for driven switches. The drive circuit drives a plurality of driven switches that are connected in parallel with one another. The driven switches each include a first main terminal, a second main terminal, and a main control terminal. When a potential difference of the main control terminal with respect to the second main terminal becomes greater than or equal to a threshold voltage, the switch is brought into an on state, in which the flow of current between the first main terminal and the second main terminal is permitted. When the potential difference becomes less than the threshold voltage, the switch is brought into an off state, in which the flow of current from the first main terminal to the second main terminal is prevented. The threshold voltages of at least two of the driven switches are different from each other. Each of the driven switches is at an electrical path, which electrically connects the second main terminal or a negative voltage supply, which is at a negative voltage lower than the potential of the second main terminal, to the main control terminal. The impedance of each of the electrical paths is set so that the potential difference increased by electric charge flowing into the electrical path through a parasitic capacitance of the driven switch becomes less than the threshold voltage. The impedance of the electrical path connected to the main control terminal of the driven switch that includes the lowest threshold voltage among the driven switches is set lower than the impedance of the electrical path connected to the main control terminal of another driven switch.

BRIEF DESCRIPTION OF THE DRAWINGS

The above features of the present disclosure will be made clearer by the following detailed description, given referring to the appended drawings. In the accompanying drawings:

FIG. 7($a$) and FIG. 7($b$) are timing charts for describing how off-holding switches are driven;

FIG. 8($a$), FIG. 8($b$), and FIG. 8($c$) are timing charts showing the changes in, for example, a gate voltage of a second switch, which is an IGBT;

FIG. 9($a$), FIG. 9($b$), and FIG. 9($c$) are timing charts showing changes in, for example, a gate voltage of a first switch, which is a MOSFET;

FIG. 10 is a plan view illustrating part of a control substrate;

DETAILED DESCRIPTION OF THE PREFERRED EMBODIMENTS

Figure 1:
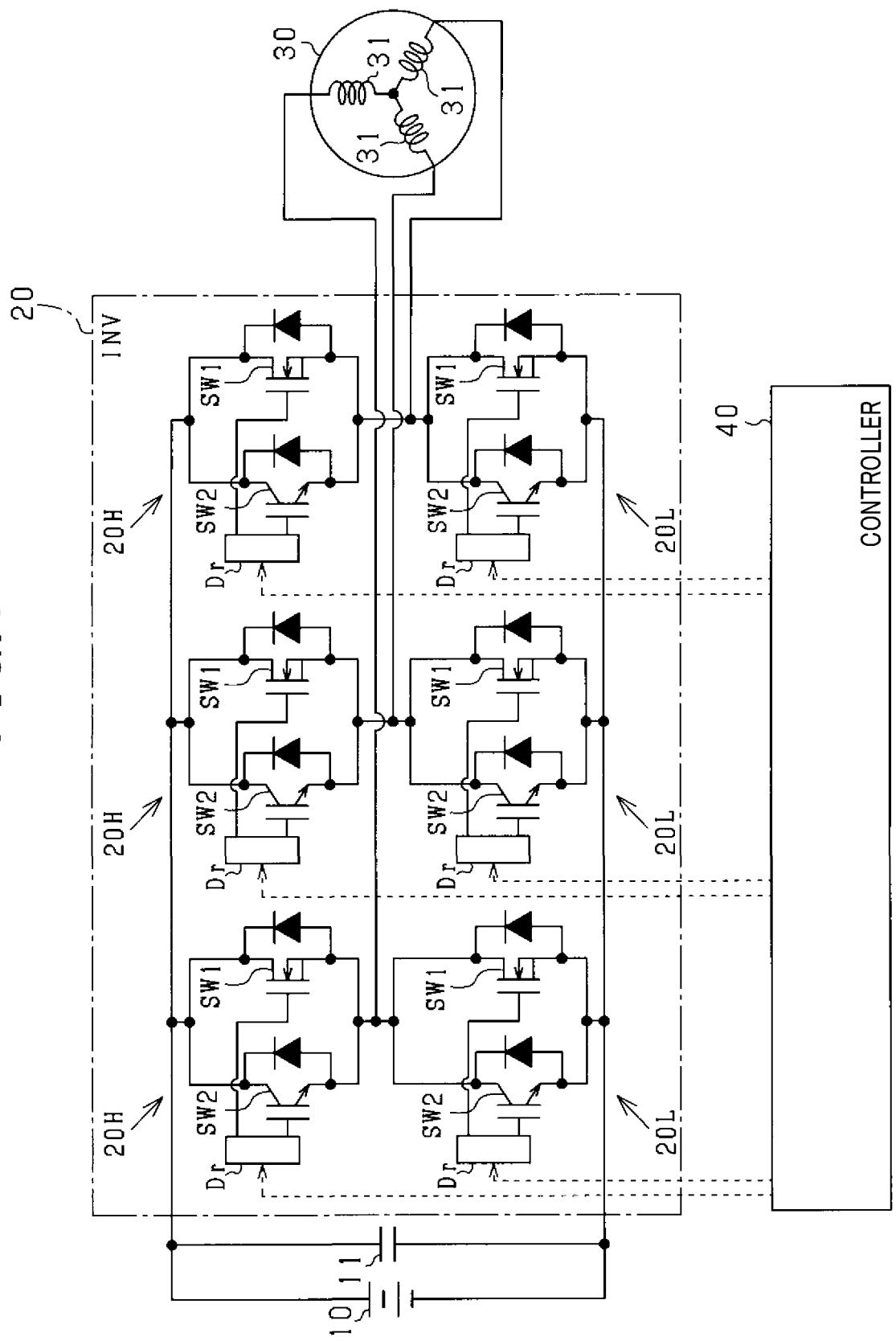
FIG. 1 is a general arrangement of a control system for a rotating electrical machine according to a first embodiment.

When the switch is in the off state, an electric charge may be supplied to the main control terminal through the parasitic capacitance of the switch. In this case, the potential difference of the main control terminal with respect to the second main terminal becomes greater than or equal to the threshold voltage, which may possibly cause self-turn-on, which is a phenomenon in which the switch is erroneously switched to the on state although the switch is supposed to be maintained in the off state. To solve the above problem, a drive circuit includes an electrical path, which electrically connects the second main terminal or a negative voltage supply, which has a negative voltage lower than the potential of the second main terminal, to the main control terminal.

As the drive circuit for switches, a drive circuit that drives multiple switches that are connected in parallel with one another has also been proposed. In this case, in each of the switches, the second main terminal or the negative voltage supply is electrically connected to the main control terminal through an electrical path. In some cases, the threshold voltages of at least two of the switches are different from each other. The switch with a lower threshold voltage is more likely to cause self-turn-on than the switch with a higher threshold voltage. Thus, a configuration for appropriately inhibiting the self-turn-on is desired in the drive circuit for driving multiple switches that are connected in parallel with one another.

The present disclosure mainly aims at providing a drive circuit for driven switches that inhibits the occurrence of self-turn-on.

The present disclosure provides a drive circuit for driven switches. The drive circuit drives a plurality of driven switches that are connected in parallel with one another. The driven switches each include a first main terminal, a second main terminal, and a main control terminal. When a potential difference of the main control terminal with respect to the second main terminal becomes greater than or equal to a threshold voltage, the switch is brought into an on state, in which the flow of current between the first main terminal and the second main terminal is permitted. When the potential difference becomes less than the threshold voltage, the switch is brought into an off state, in which the flow of current from the first main terminal to the second main terminal is prevented. The threshold voltages of at least two of the driven switches are different from each other. Each of the driven switches is at an electrical path, which electrically connects the second main terminal or a negative voltage supply, which is at a negative voltage lower than the potential of the second main terminal, to the main control terminal. The impedance of each of the electrical paths is set so that the potential difference increased by electric charge flowing into the electrical path through a parasitic capacitance of the driven switch becomes less than the threshold voltage. The impedance of the electrical path connected to the main control terminal of the driven switch that includes the lowest threshold voltage among the driven switches is set lower than the impedance of the electrical path connected to the main control terminal of another driven switch.

In the present disclosure, each of the driven switches that are connected in parallel with one another includes an electrical path, which electrically connects the second main terminal or a negative voltage supply, which is at a negative voltage lower than the potential of the second main terminal, to the main control terminal. The impedance of each of the electrical paths is set so that the potential difference increased by electric charge flowing into the electrical path through a parasitic capacitance of the driven switch becomes less than the threshold voltage. Thus, even if the threshold voltages of at least two of the driven switches are different from each other, the occurrence of self-turn-on is inhibited.

First Embodiment

Hereinafter, a drive circuit according to a first embodiment of the present disclosure will be described with reference to the drawings. The drive circuit according to the present embodiment constitutes a control system of a rotating electrical machine.

As shown in FIG. 1, the control system includes a DC power supply 10, a power converter, which is an inverter 20 in this embodiment, a rotating electrical machine 30, and a controller 40. The rotating electrical machine 30 is, for example, a vehicle-mounted main engine. The rotating electrical machine 30 is electrically connected to the DC power supply 10 through the inverter 20. In the present embodiment, the rotating electrical machine 30 is a three-phase rotating electrical machine. The rotating electrical machine 30 may be, for example, a permanent magnet synchronous machine. The DC power supply 10 is, for example, a rechargeable battery having a terminal voltage greater than or equal to 100 V. More specifically, for example, the DC power supply 10 is a secondary battery such as a lithium-ion rechargeable battery or a nickel-hydrogen rechargeable battery. A capacitor 11 is connected in parallel with the DC power supply 10.

The inverter 20 includes upper and lower arm switch sections 20H and 20L corresponding to each phase. The upper arm switch section 20H and the lower arm switch section 20L of each phase are connected in series. A first end of a coil 31 of each phase of the rotating electrical machine 30 is connected to a contact point between the upper arm switch section 20H and the lower arm switch section 20L of each phase. A second end of the coil 31 of each phase is connected at a neutral point.

Each of the switch sections 20H and 20L includes a parallel-connected assembly of a first switch SW1 and a second switch SW2. The first and second switches SW1 and SW2 correspond to driven switches. The cathode of the DC power supply 10 is connected to a first main terminal of each of the first switch SW1 and the second switch SW2 of the upper arm switch section 20H of each phase. The anode of the DC power supply 10 is connected to a second main terminal of each of the first switch SW1 and the second switch SW2 of the lower arm switch section 20L of each phase. In each phase, the first main terminal of each of the first switch SW1 and the second switch SW2 of the lower arm switch section 20L is connected to the second main terminal of each of the first switch SW1 and the second switch SW2 of the upper arm switch section 20H.

The first switch SW1 is a SiC device, which is an N-channel MOSFET in the present embodiment. Thus, in the first switch SW1, the second main terminal is a source, the first main terminal is a drain, and the main control terminal is a gate. The second switch SW2 is a Si device, which is an IGBT in the present embodiment. Thus, in the second switch SW2, the second main terminal is an emitter, the first main terminal is a collector, and the main control terminal is a gate. A freewheeling diode is connected in inverse parallel to each second switch SW2. Each first switch SW1 includes a body diode. A freewheeling diode may be connected in inverse parallel to each first switch SW1.

Figure 2:
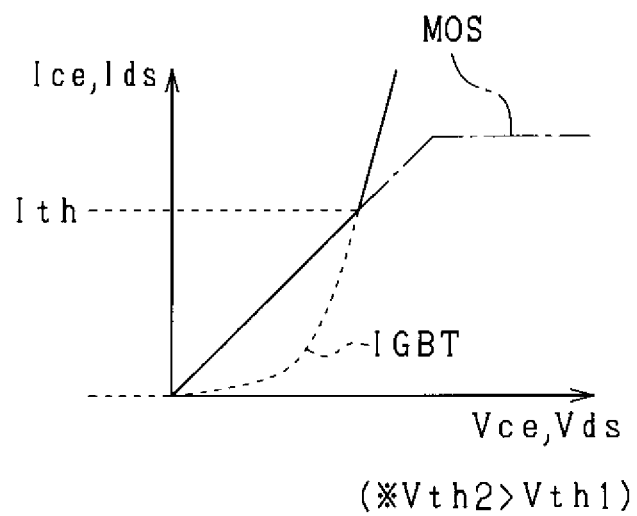
FIG. 2 is a graph showing current-voltage characteristics of switches.

In the present embodiment, each switch section is constituted by the parallel-connected assembly of the IGBT and the MOSFET for the reason of reducing a loss in a small-current region by allowing a current to flow through the MOSFET having a low on-resistance in the small-current region. Hereinafter, FIG. 2 is used for description. In FIG. 2, an alternate long and short dash line represents the voltage-current characteristic of a drain-source voltage Vds and a drain current Ids of the MOSFET, and a broken line represents the voltage-current characteristic of a collector-emitter voltage Vce and a collector current Ice of the IGBT. A solid line represents the voltage-current characteristic when the IGBT and the MOSFET are used in parallel.

As shown in FIG. 2, in the small-current region in which the current is lower than a predetermined current Ith, the drain-source voltage Vds with respect to the drain current Ids is lower than the collector-emitter voltage Vce with respect to the collector current Ice. That is, in the small-current region, the on-resistance of the MOSFET is smaller than the on-resistance of the IGBT. Thus, in the small-current region, out of the MOSFET and the IGBT, which are connected in parallel with each other, more current flows to the MOSFET. In a great-current region in which the current is greater than the predetermined current Ith, the collector-emitter voltage Vce with respect to the collector current Ice is lower than the drain-source voltage Vds with respect to the drain current Ids. That is, in the great-current region, the on-resistance of the IGBT is smaller than the on-resistance of the MOSFET. Thus, in the great-current region, out of the MOSFET and the IGBT, which are connected in parallel with each other, more current flows to the IGBT.

A threshold voltage Vth2 of the second switch SW2 is set higher than a threshold voltage Vth1 of the first switch SW1. In the present embodiment, the maximum value of the collector current Ice that is permitted to flow through the second switch SW2 is set greater than the maximum value of the drain current Ids that is permitted to flow through the first switch SW1.

Returning to the description of FIG. 1, the controller 40 drives the inverter 20 to control the control amount of the rotating electrical machine 30 to a commanded value. The control amount is, for example, a torque. To drive the switches SW1 and SW2 of the inverter 20, the controller 40 outputs a drive signal corresponding to each of the switches SW1 and SW2 to a drive circuit Dr provided separately for each of the switch sections 20H and 20L. The controller 40 generates the drive signal corresponding to each drive circuit Dr by, for example, a pulse width modulation (PWM) process based on the comparison between three-phase command voltages with a phase displacement of 120° in an electrical angle from one another and a carrier signal such as a triangular wave. The drive signal is either an on command, which instructs the switch to be brought into the on state, and an off command, which instructs the switch to be brought into the off state. In the present embodiment, the on command is represented by a signal of logic H, and the off command is represented by a signal of logic L. In each phase, the upper arm drive signal and the corresponding lower arm drive signal are alternately set to the on command. Thus, in each phase, the switches SW1 and SW2 of the upper arm switch section 20H and the switches SW1 and SW2 of the lower arm switch section 20L are alternately brought into the on state.

Figure 3:
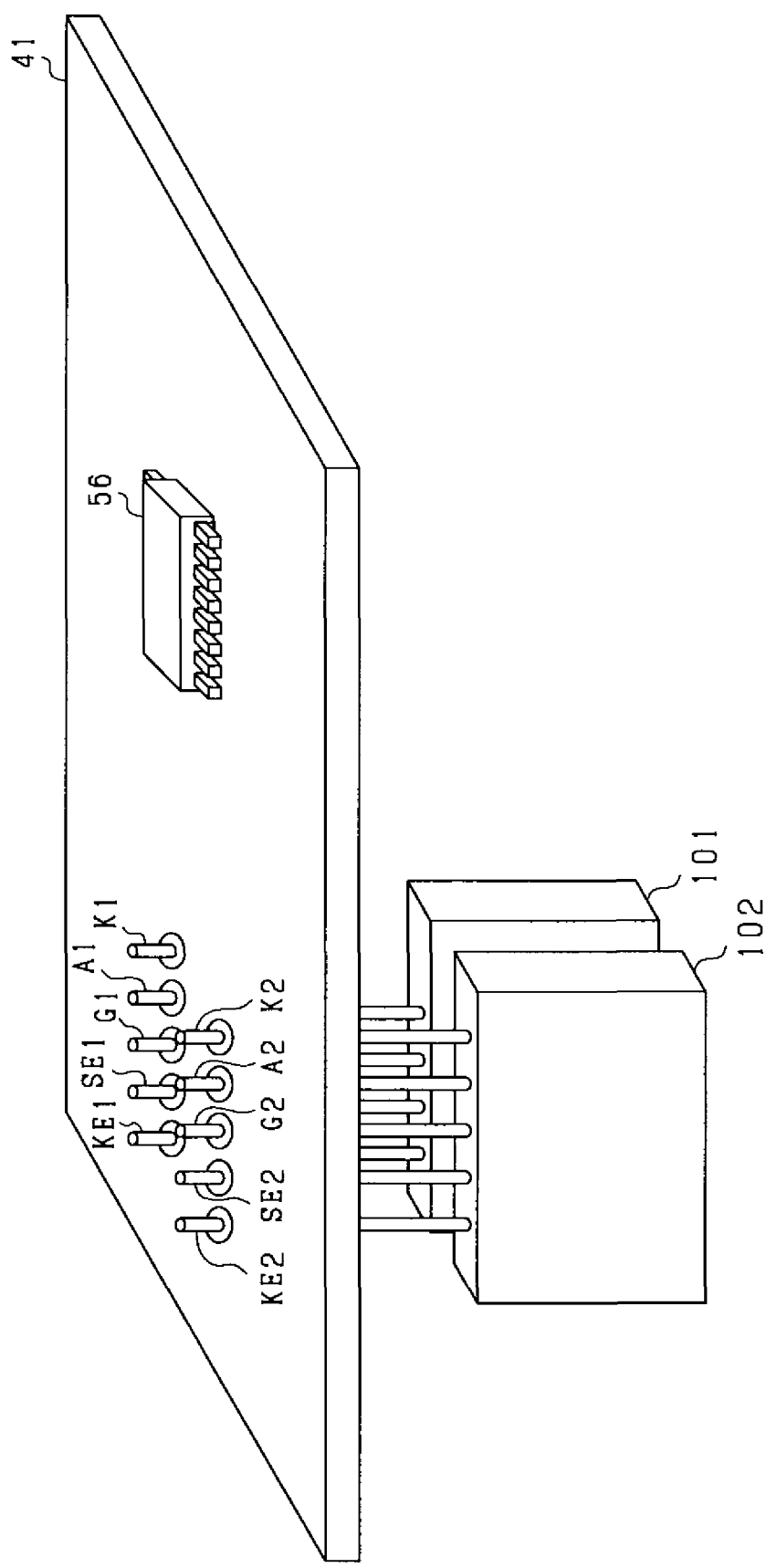
FIG. 3 is a perspective view of a part of the configuration of an inverter.

The inverter 20 will further be described with reference to FIGS. 3 to 6. FIG. 3 is a schematic diagram illustrating one of the sets of the first and second switches SW1 and SW2 of the inverter 20 and the surrounding structure.

The inverter 20 includes a control substrate 41, a first module 101, which includes the first switch SW1, and a second module 102, which includes the second switch SW2. In the present embodiment, the control substrate 41 is, for example, a printed circuit board and is a multi-layer substrate including outer layers and inner layers. The outer layers include a first surface of the control substrate 41 and a second surface that is reverse from the first surface. The inner layers are layers sandwiched between the pair of outer layers.

The first module 101 is mechanically and electrically connected to the control substrate 41 by, for example, soldering the terminals. The first module 101 includes the first switch SW1, a main body, which includes the free-wheeling diode and a first thermostatic diode, terminals, which project from the main body, and power terminals, which project from the main body. The terminals include a gate terminal G1 of the first switch SW1, a source terminal KE1, an anode terminal A1 of the first thermostatic diode, a cathode terminal K1 of the first thermostatic diode, and a sensing terminal SE1. The sensing terminal SE1 is the terminal through which a minute current that correlates with the drain current of the first switch SW1 flows. The power terminals include a first power terminal, which is short-circuited to the drain of the first switch SW1, and a second power terminal, which is short-circuited to the source of the first switch SW1.

Figure 4:
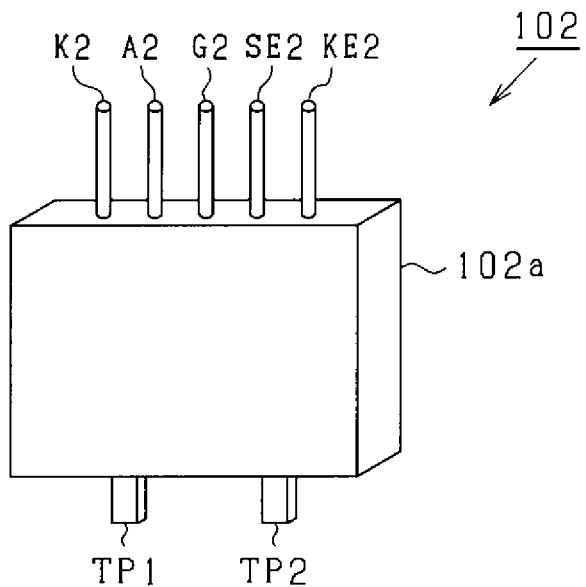
FIG. 4 is a perspective view of a module that includes a switch.
Figure 5:
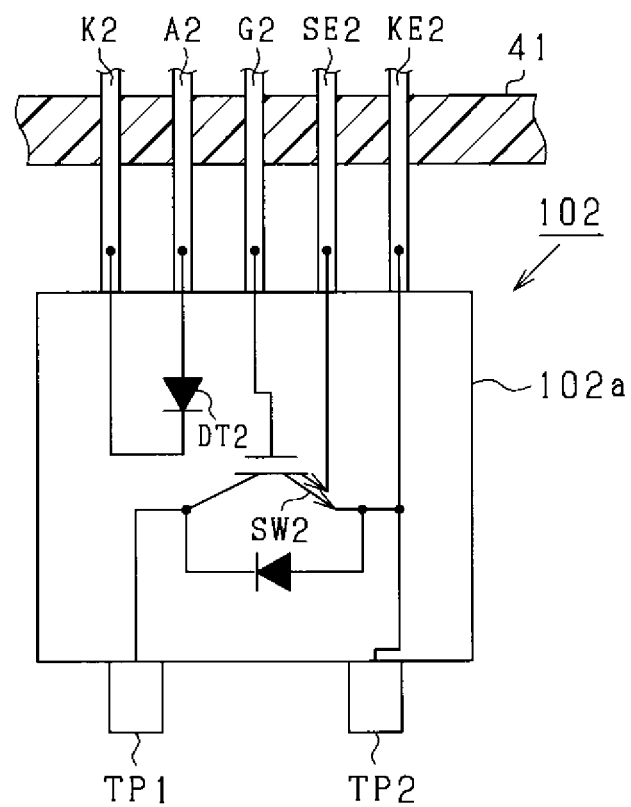
FIG. 5 is a diagram illustrating the configuration of the module.

The second module 102 includes, as shown in FIGS. 4 and 5, the second switch SW2, a main body 102a, which includes the freewheeling diode and a second thermostatic diode DT2, terminals, which project from the main body 102a, and power terminals, which project from the main body 102a. The terminals include a gate terminal G2 of the second switch SW2, an emitter terminal KE2, an anode terminal A2 of the second thermostatic diode DT2, a cathode terminal K2 of the second thermostatic diode DT2, and a sensing terminal SE2. The sensing terminal SE2 is a terminal through which a minute current that correlates with the collector current of the second switch SW2 flows. The power terminals include a first power terminal TP1, which is short-circuited to the collector of the second switch SW2, and a second power terminal TP2, which is short-circuited to the emitter of the second switch SW2. The second module 102 is mechanically and electrically connected to the control substrate 41 by, for example, soldering the terminals.

The main body of each of the modules 101 and 102 is shaped like a flat rectangular cuboid. The second module 102 will be described as an example. The terminals K2, A2, G2, SE2, and KE2 project vertically from one of a pair of surfaces of the main body 102a facing each other. The power terminals TP1 and TP2 project vertically from the other surface.

The drive circuit Dr of the switches SW1 and SW2 will be described with reference to FIG. 6.

The drive circuit Dr includes a positive voltage supply 50, a first charging switch 51A, a first charging resistance 52A, a first discharging resistance 53A, a first discharging switch 54A, and a first off-holding switch 55A. In the present embodiment, a P-channel MOSFET is used as the first charging switch 51A, and an N-channel MOSFET is used as the first discharging switch 54A and the first off-holding switch 55A. In the present embodiment, the source potential of the first switch SW1 is 0, and the output voltage of the positive voltage supply 50 is represented by VP (>0).

The positive voltage supply 50 is connected to the source of the first charging switch 51A, and the first end of the first charging resistance 52A is connected to the drain of the first charging switch 51A. The gate of the first switch SW1 is connected to the second end of the first charging resistance 52A. The first end of the first discharging resistance 53A and the drain of the first off-holding switch 55A are connected to the gate of the first switch SW1. The drain of the first discharging switch 54A is connected to the second end of the first discharging resistance 53A. The source of the first switch SW1 is connected to the source of the first discharging switch 54A and the source of the first off-holding switch 55A.

In the present embodiment, an electrical path from the gate of the first switch SW1 to the drain of the first off-holding switch 55A, the section between the drain and the source of the first off-holding switch 55A, and an electrical path from the source of the first off-holding switch 55A to the source of the first switch SW1 form a first off-holding path Loff1 corresponding to the first switch SW1.

Additionally, in the present embodiment, an electrical path from the gate of the first switch SW1 to the drain of the first discharging switch 54A through the first discharging resistance 53A, the section between the drain and the source of the first discharging switch 54A, and an electrical path from the source of the first discharging switch 54A to the source of the first switch SW1 form a first discharging path Ldis1 corresponding to the first switch SW1. Part of the first discharging path Ldis1 other than the first discharging switch 54A and the first discharging resistance 53A includes a wiring pattern.

Moreover, in the present embodiment, an electrical path from the positive voltage supply 50 to the gate of the first switch SW1 through the first charging switch 51A and the first charging resistance 52A corresponds to a non-illustrated first charging path Lch1 corresponding to the first switch SW1. Part of the first charging path Lch1 other than the first charging switch 51A and the first charging resistance 52A includes a wiring pattern.

The drive circuit Dr includes a second charging switch 51B, a second charging resistance 52B, a second discharging resistance 53B, a second discharging switch 54B, and a second off-holding switch 55B. In the present embodiment, a P-channel MOSFET is used as the second charging switch 51B, and an N-channel MOSFET is used as the second discharging switch 54B and the second off-holding switch 55B. In the present embodiment, the emitter potential of the second switch SW2 is 0.

The positive voltage supply 50 is connected to the source of the second charging switch 51B, and the gate of the second switch SW2 is connected to the drain of the second charging switch 51B through the second charging resistance 52B. The first end of the second discharging resistance 53B and the drain of the second off-holding switch 55B are connected to the gate of the second switch SW2. The drain of the second discharging switch 54B is connected to the second end of the second discharging resistance 53B. The gate of the second switch SW2 is connected to the source of the second discharging switch 54B and the source of the second off-holding switch 55B.

In the present embodiment, an electrical path from the gate of the second switch SW2 to the drain of the second off-holding switch 55B, the section between the drain and the source of the second off-holding switch 55B, and an electrical path from the source of the second off-holding switch 55B to the source of the second switch SW2 form a second off-holding path Loff2 corresponding to the second switch SW2.

In the present embodiment, an electrical path from the gate of the second switch SW2 to the drain of the second discharging switch 54B through the second discharging resistance 53B, the section between the drain and the source of the second discharging switch 54B, and an electrical path from the source of the second discharging switch 54B to the source of the second switch SW2 form a second discharging path Ldis2 corresponding to the second switch SW2. Part of the second discharging path Ldis2 other than the second discharging switch 54B and the second discharging resistance 53B includes a wiring pattern.

In the present embodiment, an electrical path from the positive voltage supply 50 to the gate of the second switch SW2 through the second charging switch 51B and the second charging resistance 52B corresponds to a non-illustrated second charging path Lch2 corresponding to the second switch SW2. Part of the second charging path Lch2 other than the second charging switch 51B and the second charging resistance 52B includes a wiring pattern.

The drive circuit Dr includes a drive control section 56. If it is determined that the drive signal of the first switch SW1 acquired from the controller 40 is the on command, the drive control section 56 brings the first charging switch 51A into the on state and brings the first discharging switch 54A and the first off-holding switch 55A into the off state. In this case, the output voltage VP of the positive voltage supply 50 is supplied to the gate of the first switch SW1, so that a charging current is supplied from the positive voltage supply 50 to the gate of the first switch SW1. As a result, a gate voltage Vgs of the first switch SW1 becomes greater than or equal to the threshold voltage Vth1 of the first switch SW1, so that the first switch SW1 is switched to the on state, which permits the current flow between the drain and the source of the first switch SW1.

If it is determined that the acquired drive signal of the first switch SW1 is the off command, the drive control section 56 brings the first charging switch 51A into the off state and brings the first discharging switch 54A into the on state. In this case, a discharge current flows from the gate of the first switch SW1 to the source of the first switch SW1 through the first discharging resistance 53A and the first discharging switch 54A. As a result, the gate voltage Vgs of the first switch SW1 becomes less than the threshold voltage Vth1, so that the first switch SW1 is brought into the off state, which prevents the current flow from the drain to the source of the first switch SW1.

If it is determined that the drive signal of the second switch SW2 acquired from the controller 40 is the on command, the drive control section 56 brings the second charging switch 51B into the on state and brings the second discharging switch 54B and the second off-holding switch 55B into the off state. In this case, the output voltage VP of the positive voltage supply 50 is supplied to the gate of the second switch SW2, and a gate voltage Vge of the second switch SW2 becomes greater than or equal to the threshold voltage Vth2 of the second switch SW2, so that the second switch SW2 is switched to the on state. This permits the current flow from the collector to the emitter of the second switch SW2.

If it is determined that the acquired drive signal of the second switch SW2 is the off command, the drive control section 56 brings the second charging switch 51B into the off state and brings the second discharging switch 54B into the on state. In this case, a discharge current flows from the gate of the second switch SW2 to the emitter of the second switch SW2 through the second discharging resistance 53B and the second discharging switch 54B. As a result, the gate voltage Vge of the second switch SW2 becomes less than the threshold voltage Vth2, so that the second switch SW2 is brought into the off state, which interrupts the current flow from the collector to the emitter of the second switch SW2.

In the present embodiment, the logics of the drive signals of the first and second switches SW1 and SW2 input to the drive control section 56 from the controller 40 are synchronized. Thus, the first and second switches SW1 and SW2 are brought into the on state and the off state in synchronization with each other by the drive control section 56.

The drive control section 56 has a function of monitoring the gate voltage Vgs of the first switch SW1. The drive control section 56 brings the first off-holding switch 55A into the on state if it is determined that the drive signal is the off command, and the gate voltage Vgs of the first switch SW1 is less than or equal to a first specified voltage and performs an off-holding process in which the first off-holding switch 55A is maintained in the off state in other cases. The first specified voltage is set less than or equal to the threshold voltage Vth1 of the first switch SW1 and is set to the threshold voltage Vth1 in the present embodiment.

The drive control section 56 has a function of monitoring the gate voltage Vge of the second switch SW2. The drive control section 56 brings the second off-holding switch 55B into the on state if it is determined that the drive signal is the off command, and the gate voltage Vge of the second switch SW2 is less than or equal to a second specified voltage and performs the off-holding process in which the second off-holding switch 55B is maintained in the off state in other cases. The second specified voltage is set less than or equal to the threshold voltage Vth2 of the second switch SW2 and is set to the threshold voltage Vth2 in the present embodiment.

As shown in FIG. 7, for example, the off-holding process inhibits the self-turn-on of the upper arm switch that is otherwise caused when the switching noise generated by switching the lower arm switch to the on state is transmitted to the gate of the upper arm switch. FIG. 7 shows the second switches SW2 as examples of the upper and lower arm switches and also shows the changes in the gate voltage of the switches. In FIG. 7, at a point in time t1, the drive signal is switched to the off command, and at a point in time t2, the off-holding process of the upper arm second switch SW2 is started.

The function provided by the drive control section 56 can be provided by, for example, software stored in a tangible storage device and a computer, hardware, or a combination of the computer and the hardware that executes the software.

Subsequently, the fact that the first switch SW1 is more likely to cause self-turn-on than the second switch SW2 will be described with reference to FIGS. 8 and 9.

First, the second switch SW2 will be described with reference to FIG. 8. FIG. 8(a) shows the changes in the gate voltage Vge of the second switch SW2, FIG. 8(b) shows the collector current Ice of the second switch SW2, and FIG. 8(c) shows the collector-emitter voltage Vce of the second switch SW2. The gate voltage Vge is positive when the gate potential is higher than the emitter potential.

At a point in time t1, the drive signal of the second switch SW2 is switched to the on command, and the gate voltage Vge starts to increase. Subsequently, at a point in time t2, the gate voltage Vge reaches the output voltage VP of the positive voltage supply 50. Subsequently, at a point in time t3, the drive signal is switched to the off command, so that the gate voltage Vge starts to decrease, and at a point in time t4, the gate voltage Vge becomes 0. After that, for example, the switch of the opposite arm is switched to the on state, which causes the gate voltage Vge to be undesirably increased in spite of the off command. However, even if the gate voltage Vge is increased, the gate voltage Vge does not become greater than or equal to the threshold voltage Vth2 since the threshold voltage Vth2 of the second switch SW2 is relatively high.

Subsequently, the first switch SW1 will be described with reference to FIG. 9. FIG. 9(a) shows the changes in the gate voltage Vgs of the first switch SW1, FIG. 9(b) shows the changes in the drain current Ids of the first switch SW1, and FIG. 9(c) shows the changes in the drain-source voltage Vds of the first switch SW1. The gate voltage Vgs is positive when the gate potential is higher than the source potential.

At a point in time t1, the drive signal of the first switch SW1 is switched to the on command, so that the gate voltage Vgs starts to increase. Subsequently, at a point in time t2, the gate voltage Vgs reaches the output voltage VP of the positive voltage supply 50. Subsequently, at a point in time t3, the drive signal is switched to the off command, so that the gate voltage Vgs starts to decrease, and at a point in time t4, the gate voltage Vgs becomes 0. After that, for example, the switch of the opposite arm is switched to the on state, which causes the gate voltage Vgs to be undesirably increased in spite of the off command. The threshold voltage Vth1 of the first switch SW1 is lower than the threshold voltage Vth2 of the second switch SW2. Thus, due to the increase in the gate voltage Vgs, the gate voltage Vgs undesirably becomes greater than or equal to the threshold voltage Vth1. As a result, the self-turn-on of the first switch SW1 undesirably occurs.

The configuration aimed at addressing such a problem will be described with reference to FIG. 10. FIG. 10 is a diagram illustrating the control substrate 41 as viewed from the first surface. In FIG. 10, the illustration of the first charging switch 51A and like components are omitted.

The drive control section 56 is provided on the first surface of the control substrate 41. The terminals K1, A1, G1, SE1, and KE1 of the first module 101 are connected to the position on the control substrate 41 separate from the drive control section 56 in a manner aligned in a row. The terminals K2, A2, G2, SE2, and KE2 of the second module 102 are connected to the position on the control substrate 41 separate from the drive control section 56 in a manner aligned in a row. The terminals K1, A1, G1, SE1, and KE1 of the first module 101 and the terminals K2, A2, G2, SE2, and KE2 of the second module 102 are parallel.

The first and second off-holding switches 55A and 55B are located on the first surface of the control substrate 41 between the terminals K1, A1, G1, SE1, and KE1 of the first module 101 and the terminals K2, A2, G2, SE2, and KE2 of the second module 102. The first off-holding switch 55A is located closer to the gate terminal G1 of the first module 101 in a first direction in which the gate terminal G1 of the first module 101 faces the gate terminal G2 of the second module 102. The second off-holding switch 55B is located closer to the gate terminal G2 of the second module 102 in the first direction. In a second direction in which the gate terminals G1 and G2 face the drive control section 56, the second off-holding switch 55B is located closer to the drive control section 56 than the first off-holding switch 55A and the gate terminals G1 and G2. In the present embodiment, the off-holding switches 55A and 55B are external discrete components.

A first A path 61A and a first B path 61B, which constitute the first off-holding path Loff1, are located on the first surface of the control substrate 41. In the present embodiment, the first A path 61A and the first B path 61B are wiring patterns. The first A path 61A connects the gate terminal G1 of the first switch SW1 to the drain of the first off-holding switch 55A. The first B path 61B connects the source of the first off-holding switch 55A to the source terminal KE1, which is short-circuited to the source of the first switch SW1.

A first signal path 62, which connects the gate of the first off-holding switch 55A to the drive control section 56, is located on the first surface of the control substrate 41. The drive control section 56 turns on and off the first off-holding switch 55A through the first signal path 62.

A second A path 63A and a second B path 63B, which constitute the second off-holding path Loff2, are located on the first surface of the control substrate 41. In the present embodiment, the second A path 63A and the second B path 63B are wiring patterns. The second A path 63A connects the gate terminal G2 of the second switch SW2 to the drain of the second off-holding switch 55B. The second B path 63B connects the source of the second off-holding switch 55B to the emitter terminal KE2, which is short-circuited to the emitter of the second switch SW2.

A second signal path 64, which connects the gate of the second off-holding switch 55B to the drive control section 56, is located on the first surface of the control substrate 41. The drive control section 56 turns on and off the second off-holding switch 55B through the second signal path 64. As viewed from the front of the first surface of the control substrate 41, a part of the second signal path 64 that intersects the second A path 63A crosses the second A path 63A through the inner layers and via holes of the control substrate 41.

In the present embodiment, the impedance of the first off-holding path Loff1 when the first off-holding switch 55A is in the on state is made lower than the impedance of the second off-holding path Loff2 when the second off-holding switch 55B is in the on state by the following configurations (A1) to (A3).

(A1) In this configuration, the distance between the gate terminal G1 of the first switch SW1 and the first off-holding switch 55A is shorter than the distance between the gate terminal G2 of the second switch SW2 and the second off-holding switch 55B.

(A2) In this configuration, the width of the first A path 61A and the first B path 61B, which constitute the first off-holding path Loff1, is greater than the width of the second A path 63A and the second B path 63B, which constitute the second off-holding path Loff2.

(A3) In this configuration, the length of each of the first A path 61A and the first B path 61B, which constitute the first off-holding path Loff1, is shorter than the length of each of the second A path 63A and the second B path 63B, which constitute the second off-holding path Loff2.

As described above, in the present embodiment, the impedance of the first off-holding path Loff1 of the first switch SW1 having a relatively low threshold voltage is made lower than the impedance of the second off-holding path Loff2 of the second switch SW2 having a relatively high threshold voltage. Even if electric charge flows into the gate of the switch during the off-holding process, the smaller the impedance of the off-holding path, the less the increasing degree of the gate voltage becomes. Thus, according to the present embodiment, even if electric charge flows into the gate of each of the first and second switches SW1 and SW2 through, for example, the parasitic capacitance of the switch, the peak value of the gate voltage increased by the electric charge is less than the threshold voltage during the off-holding process. This inhibits the occurrence of the self-turn-on of the first and second switches SW1 and SW2.

Modification 1 of First Embodiment

Figure 6:
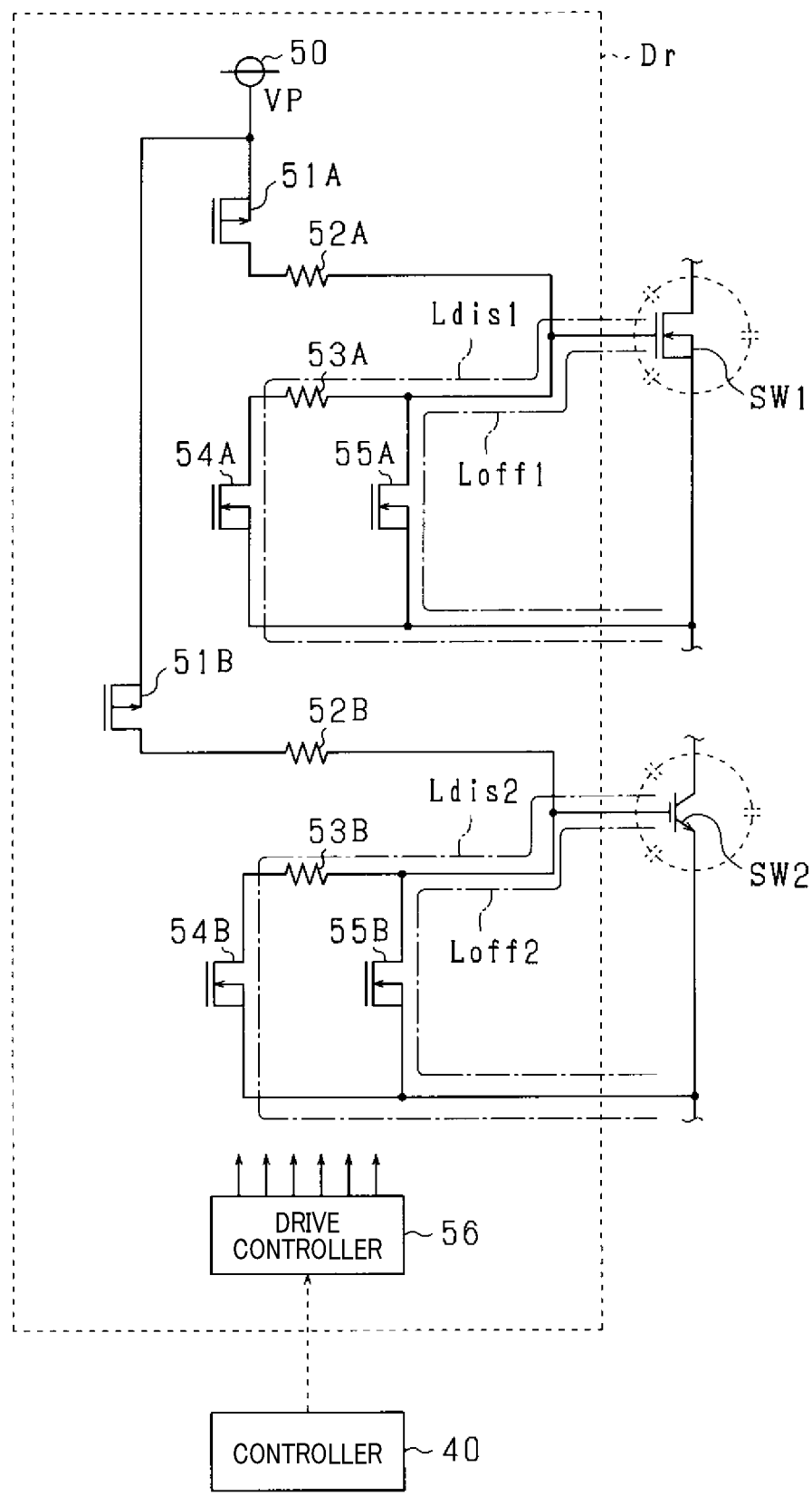
FIG. 6 is a diagram illustrating the configuration of a drive circuit.
Figure 11:
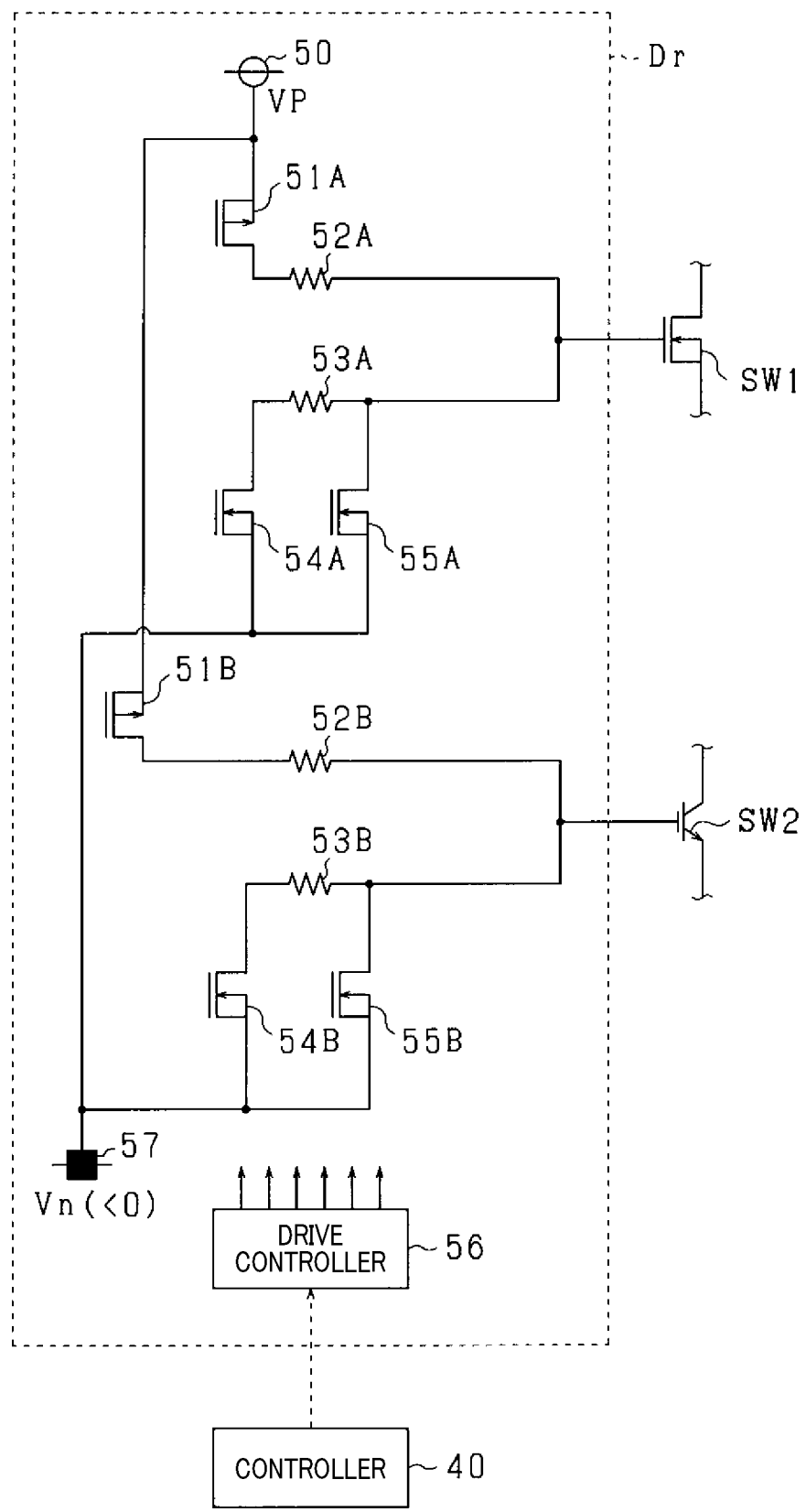
FIG. 11 is a diagram illustrating the configuration of a drive circuit according to a modification 1 of the first embodiment.

Instead of the configuration of FIG. 6, as shown in FIG. 11, the drive circuit Dr may include a negative voltage supply 57. In FIG. 11, for purpose of illustration, the components that are the same as the components shown in FIG. 6 are given the same reference numerals.

The negative voltage supply 57 outputs a negative voltage Vn (<0) that is lower than the source potential of the first switch SW1 and the emitter potential of the second switch SW2. The sources of the first discharging switch 54A and the first off-holding switch 55A are not connected to the source of the first switch SW1, but are connected to the negative voltage supply 57. The sources of the second discharging switch 54B and the second off-holding switch 55B are not connected to the emitter of the second switch SW2, but are connected to the negative voltage supply 57.

The off-holding path of the present embodiment will be described with the first switch SW1 as an example. The first off-holding path Loff1 includes the electrical path from the gate of the first switch SW1 to the drain of the first off-holding switch 55A, the section between the drain and the source of the first off-holding switch 55A, and the electrical path from the source of the first off-holding switch 55A to the negative voltage supply 57.

Modification 2 of First Embodiment

Figure 12:
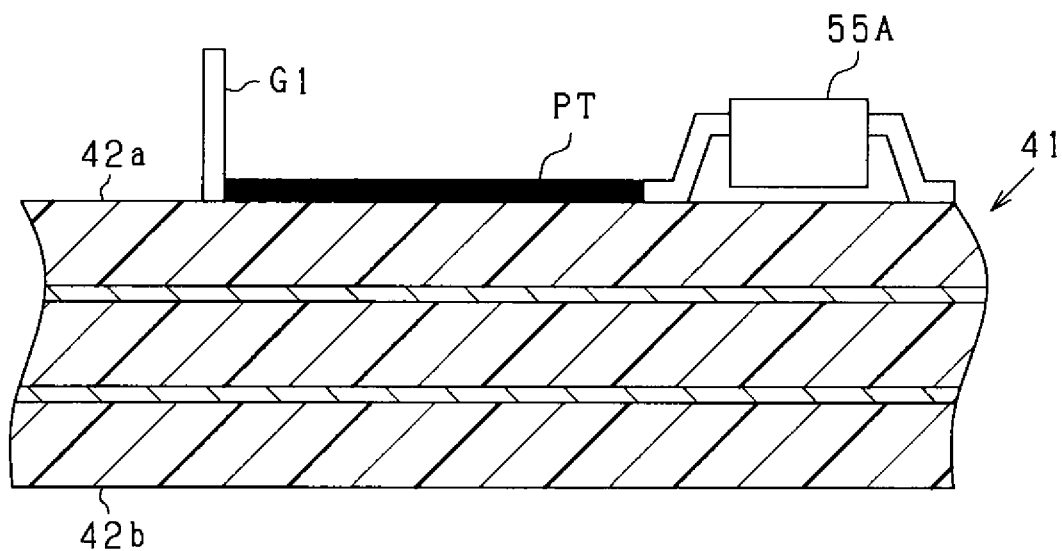
FIG. 12 is a diagram illustrating the cross-sectional structure of the control substrate of the first embodiment.
Figure 13:
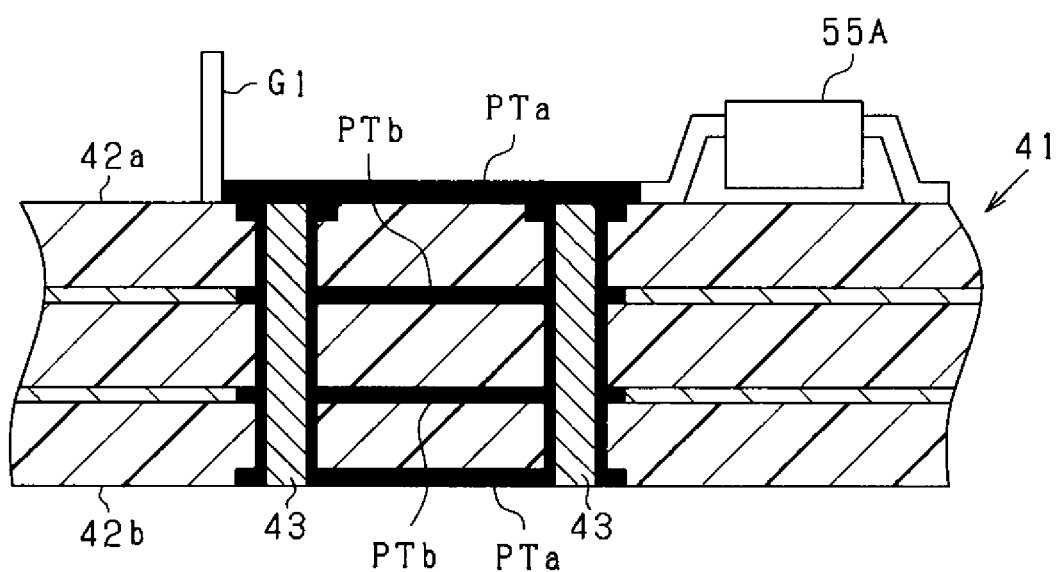
FIG. 13 is a diagram illustrating a cross-sectional structure of a control substrate according to a modification 2 of the first embodiment.

As the wiring pattern of the off-holding path, FIG. 12 shows a wiring pattern PT located on a first surface 42a, which is the outer layer of the control substrate 41. However, the wiring pattern of the off-holding path is not limited to this. For example, the wiring pattern of the off-holding path may be formed as a parallel-connected assembly of the wiring pattern located on the outer layer and the wiring pattern located on at least one of the inner layers of the control substrate 41. FIG. 13 shows an example in which a wiring pattern PTa located on each of the outer layers including the first surface 42a and a second surface 42b and wiring patterns PTb located on the inner layers are parallel-connected through via holes 43. The configuration shown in FIG. 13 reduces the impedance by ¼ from the configuration shown in FIG. 12. FIGS. 12 and 13 also show the gate terminal G1 and the first off-holding switch 55A. The wiring pattern PT of FIG. 12 corresponds to the first A path 61A of FIG. 10.

Second Embodiment

Figure 14:
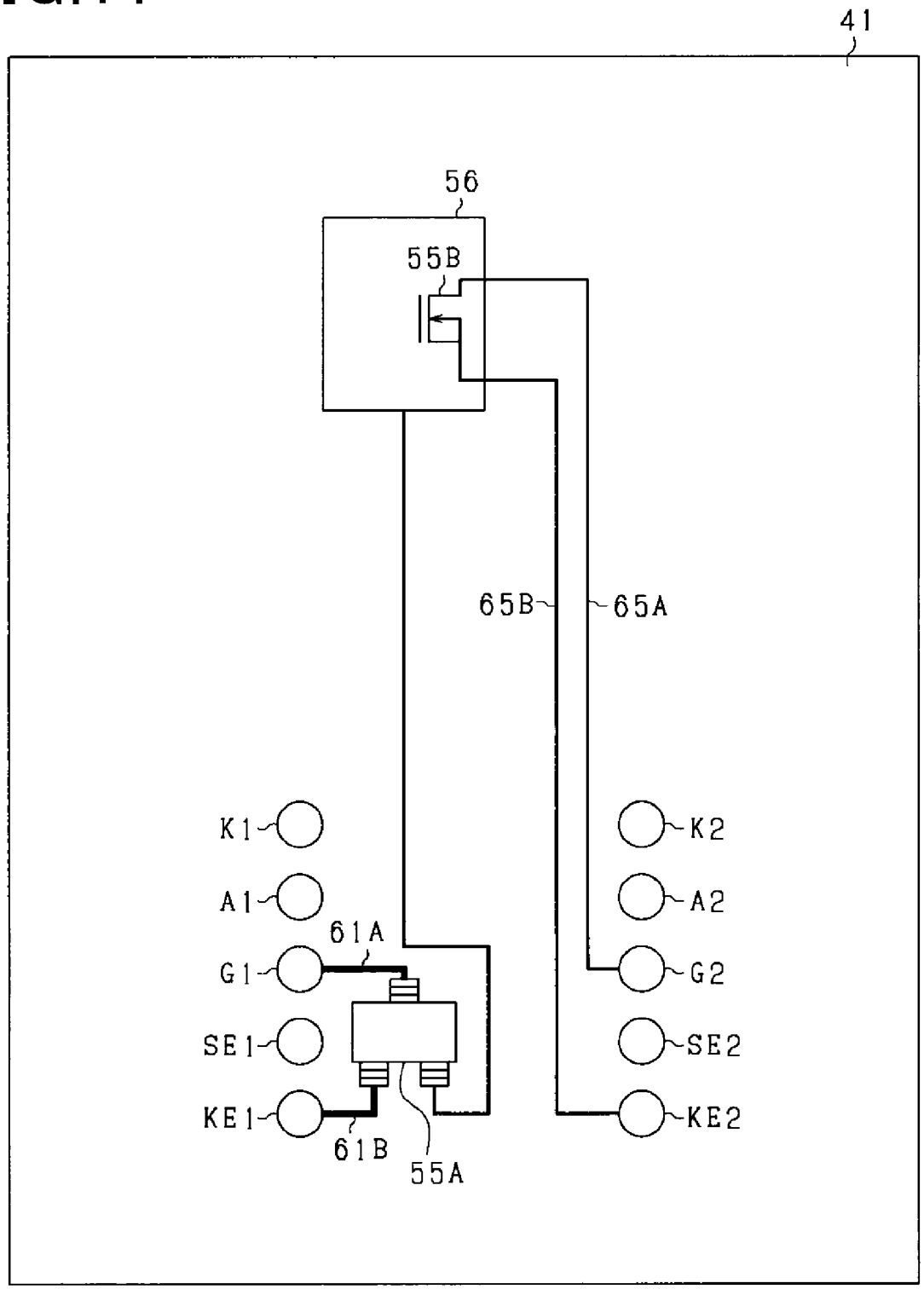
FIG. 14 is a plan view illustrating part of a control substrate according to a second embodiment.

Hereinafter, a second embodiment will be described with reference to the drawings focusing on the differences from the first embodiment. In the present embodiment, as shown in FIG. 14, the second off-holding switch 55B is included in the drive control section 56. In FIG. 14, for purpose of illustration, the components that are the same as the components shown in FIG. 10 are given the same reference numerals.

Like the first embodiment, the first off-holding switch 55A is located on the control substrate 41 outside of the drive control section 56.

A second A path 65A and a second B path 65B, which constitute the second off-holding path Loff2, are located on the first surface of the control substrate 41. The second A path 65A connects the gate terminal G2 of the second switch SW2 to the drain of the second off-holding switch 55B. The second B path 65B connects the source of the second off-holding switch 55B to the emitter terminal KE2, which is short-circuited to the emitter of the second switch SW2. The length of each of the first A path 61A and the first B path 61B is shorter than the length of each of the second A path 65A and the second B path 65B. The width of the first A path 61A and the first B path 61B is greater than the width of the second A path 65A and the second B path 65B.

According to the present embodiment, the first off-holding switch 55A is located close to the gate terminal G1. Thus, the first off-holding path Loff1 is shorter than the second off-holding path Loff2, so that the impedance of the first off-holding path Loff1 is smaller than the impedance of the second off-holding path Loff2.

According to the present embodiment, the second off-holding switch 55B is included in the drive control section 56. Thus, the second off-holding switch 55B does not need to be located on the first surface of the control substrate 41. This simplifies the structure of the drive circuit Dr.

Third Embodiment

Figure 15:
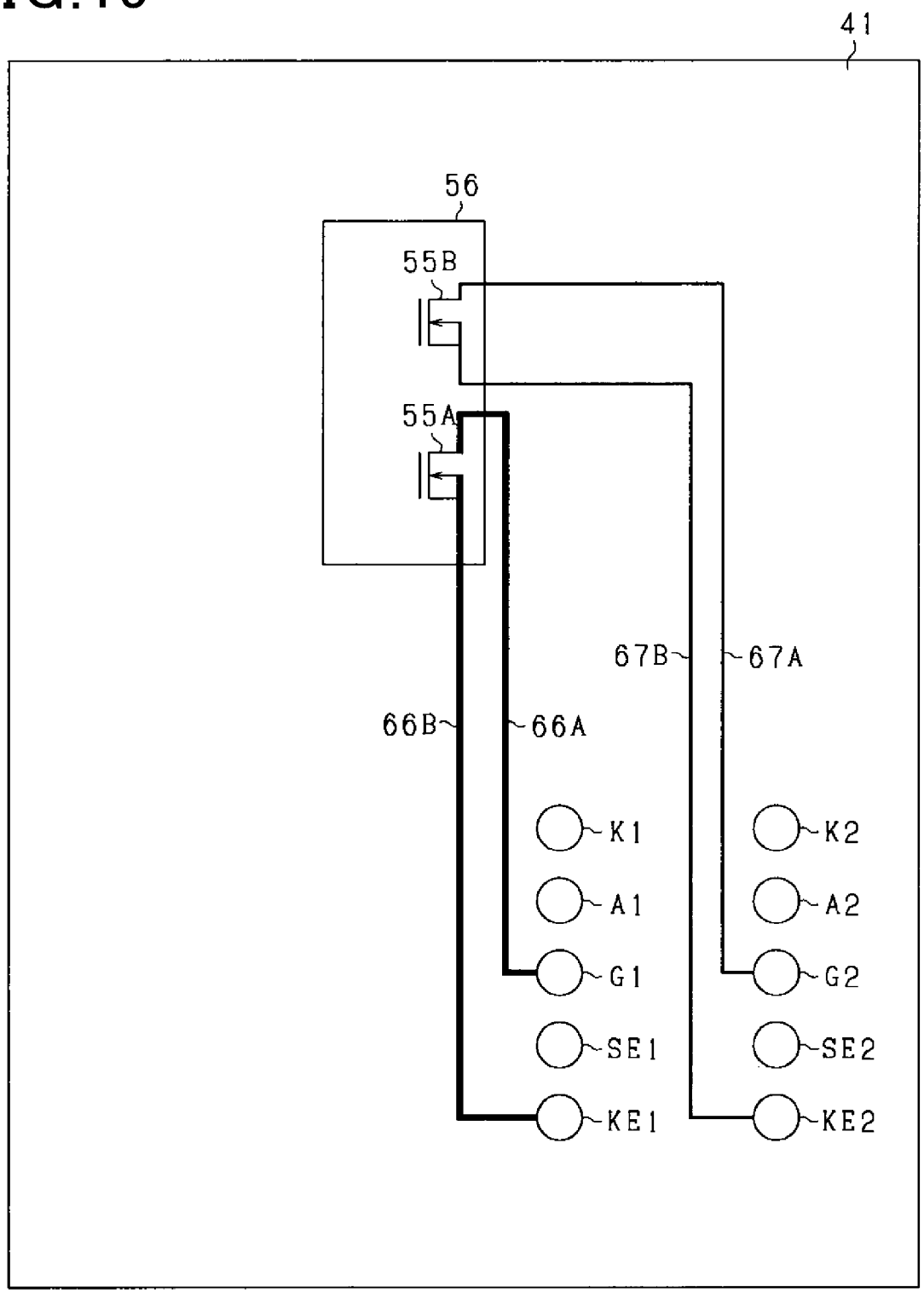
FIG. 15 is a plan view illustrating part of a control substrate according to a third embodiment.

Hereinafter, a third embodiment will be described with reference to the drawings focusing on the differences from the second embodiment. In the present embodiment, as shown in FIG. 15, the first off-holding switch 55A is also included in the drive control section 56. In FIG. 15, for purpose of illustration, the components that are the same as the components shown in FIG. 14 are given the same reference numerals.

A first A path 66A and a first B path 66B, which constitute the first off-holding path Loff1, are located on the first surface of the control substrate 41. The first A path 66A connects the gate terminal G1 of the first switch SW1 to the drain of the first off-holding switch 55A. The first B path 66B connects the source of the first off-holding switch 55A to the source terminal KE1, which is short-circuited to the source of the first switch SW1.

A second A path 67A and a second B path 67B, which constitute the second off-holding path Loff2, are located on the first surface of the control substrate 41. The second A path 67A connects the gate terminal G2 of the second switch SW2 to the drain of the second off-holding switch 55B. The second B path 67B connects the source of the second off-holding switch 55B to the emitter terminal KE2, which is short-circuited to the emitter of the second switch SW2. The length of each of the first A path 66A and the first B path 66B is shorter than the length of each of the second A path 67A and the second B path 67B. The width of the first A path 66A and the first B path 66B is greater than the width of the second A path 67A and the second B path 67B.

The drive control section 56 is located on the control substrate 41 close to the gate terminal G1 out of the gate terminals G1 and G2. Thus, the distance between the gate terminal G1 of the first switch SW1 and the drive control section 56 is shorter than the distance between the gate terminal G2 of the second switch SW2 and the drive control section 56.

According to the above-described embodiment, the off-holding switches 55A and 55B are included in the drive control section 56. This further simplifies the drive circuit Dr.

Fourth Embodiment

Figure 16:
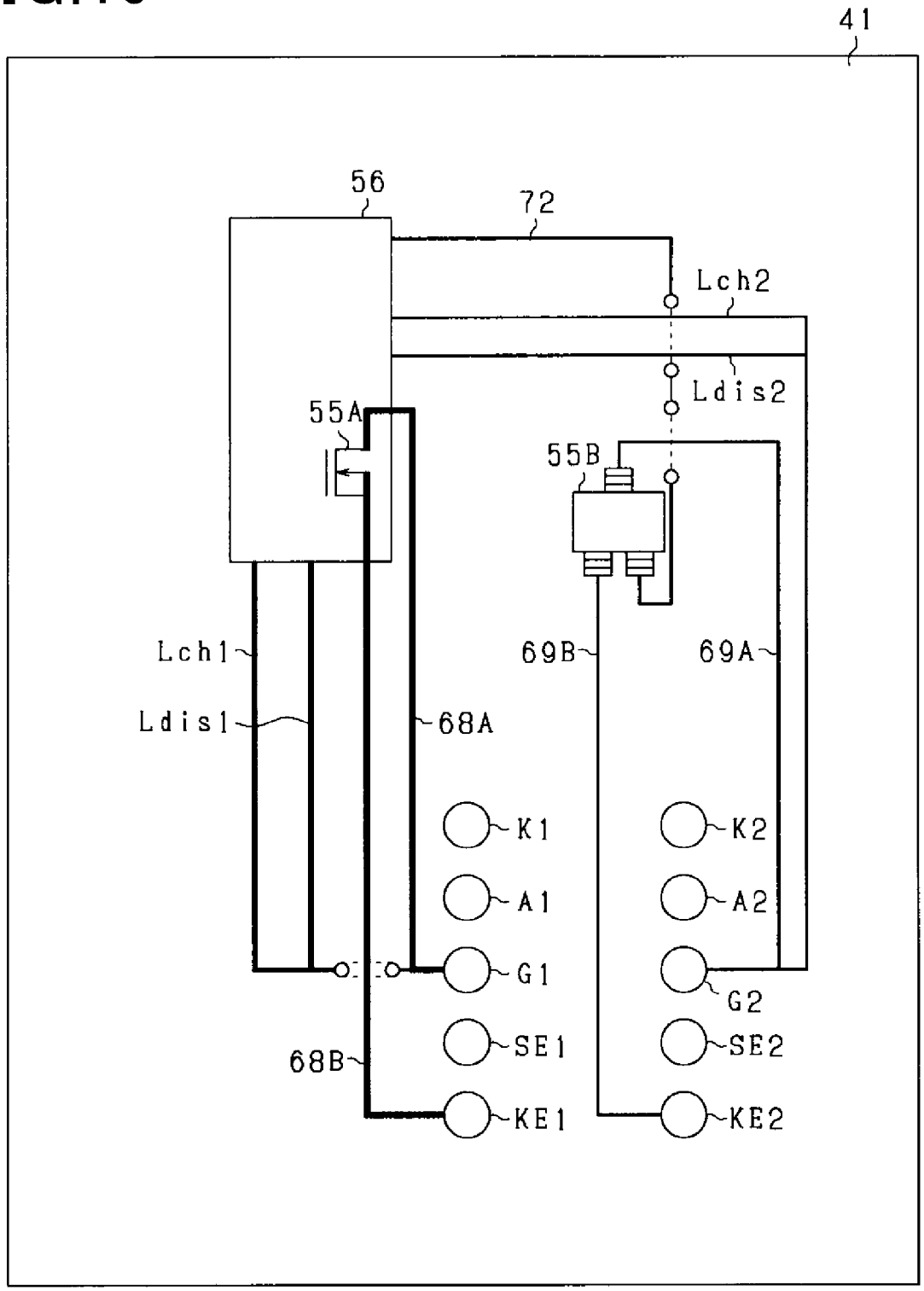
FIG. 16 is a plan view illustrating part of a control substrate according to a fourth embodiment.

Hereinafter, a fourth embodiment will be described with reference to the drawings focusing on the differences from the first embodiment. In the present embodiment, as shown in FIG. 16, the space between the terminals K1, A1, G1, SE1, and KE1 of the first module 101 and the terminals K2, A2, G2, SE2, and KE2 of the second module 102 is narrow. Thus, the off-holding switches cannot be located in a region between the terminals K1, A1, G1, SE1, and KE1 of the first module 101 and the terminals K2, A2, G2, SE2, and KE2 of the second module 102 on the first surface of the control substrate 41. In the present embodiment, the method for placing, for example, the off-holding switches on the control substrate 41 is changed. In FIG. 16, for purpose of illustration, the components that are the same as the components shown in FIG. 10 are given the same reference numerals.

The drive control section 56 is located on the first surface of the control substrate 41 on the opposite side of the gate terminal G1 of the first module 101 from the gate terminal G2 of the second module 102 in the first direction. The drive control section 56 is located apart from the cathode terminals K1 and K2 in the second direction. The drive control section 56 includes the first off-holding switch 55A.

The second off-holding switch 55B is located on the first surface of the control substrate 41 apart from the cathode terminals K1 and K2 in the second direction. A signal path 72, which connects the gate of the second off-holding switch 55B to the drive control section 56, is located on the first surface of the control substrate 41.

A first A path 68A and a first B path 68B, which constitute the first off-holding path Loff1, are located on the first surface of the control substrate 41. The first A path 68A connects the gate terminal G1 of the first switch SW1 to the drain of the first off-holding switch 55A. The first B path 68B connects the source of the first off-holding switch 55A to the source terminal KE1, which is short-circuited to the source of the first switch SW1. The first A path 68A is located on the control substrate 41 closer to the drive control section 56 than the gate terminal G1 of the first switch SW1 in the first direction. The first B path 68B is located on the control substrate 41 on the opposite side of the first A path 68A from the gate terminal G1 in the second direction.

A second A path 69A and a second B path 69B, which constitute the second off-holding path Loff2, are located on the first surface of the control substrate 41. The second A path 69A connects the gate terminal G2 of the second switch SW2 to the drain of the second off-holding switch 55B. The second B path 69B connects the source of the second off-holding switch 55B to the emitter terminal KE2 of the second switch SW2. The second A path 69A is located on the control substrate 41 on the opposite side of the gate terminal G2 of the second switch SW2 from the gate terminal G1 of the first switch SW1 in the first direction. The second B path 69B is located on the control substrate 41 in a region between the terminals K1, A1, G1, SE1, and KE1 of the first module 101 and the terminals K2, A2, G2, SE2, and KE2 of the second module 102 in the second direction.

The first charging path Lch1, the second charging path Lch2, the first discharging path Ldis1, and the second discharging path Ldis2 are located on the first surface of the control substrate 41. In FIG. 16, the illustration of components such as the switches on the passages Lch1, Lch2, Ldis1, and Ldis2 is omitted.

The first discharging path Ldis1 is located on the control substrate 41 on the opposite side of the first B path 68B from the first A path 68A. The first charging path Lch1 is located on the control substrate 41 on the opposite side of the first discharging path Ldis1 from the first B path 68B.

The second charging path Lch2 and the second discharging path Ldis2 are located on the control substrate 41 in a region on the opposite side of the second off-holding switch 55B from the gate terminals G1 and G2 in the second direction and in a region on the opposite side of the second off-holding switch 55B from the drive control section 56 in the first direction.

As viewed from the front of the first surface of the control substrate 41, parts of the signal path 72 intersecting the second charging path Lch2, the second discharging path Ldis2, and the second A path 69A cross the passages Lch2, Ldis2, and 69A through the inner layers and via holes of the control substrate 41. Additionally, as viewed from the front of the first surface of the control substrate 41, a part of the first charging path Lch1 and the first discharging path Ldis1 intersecting the first B path 68B crosses the first B path 68B through the inner layers and via holes of the control substrate 41.

The width of the first A path 68A and the first B path 68B is greater than the width of the second A path 69A and the second B path 69B. Thus, the impedance of the first off-holding path Loff1 is made lower than the impedance of the second off-holding path Loff2.

The length of the first charging path Lch1 is shorter than the length of the second charging path Lch2. Additionally, the width of the wiring pattern forming the first charging path Lch1 is greater than the width of the wiring pattern forming the second charging path Lch2. Thus, the impedance of the first charging path Lch1 when the first charging switch 51A is in the on state is made lower than the impedance of the second charging path Lch2 when the second charging switch 51B is in the on state. Thus, the charging speed of the gate of the first switch SW1 is made higher than the charging speed of the gate of the second switch SW2. This increases the switching speed when the first switch SW1 is switched to the on state. As a result, the switching loss is reduced.

The length of the first discharging path Ldis1 is shorter than the length of the second discharging path Ldis2. Additionally, the width of the wiring pattern forming the first discharging path Ldis1 is greater than the width of the wiring pattern forming the second discharging path Ldis2. Thus, the impedance of the first discharging path Ldis1 when the first discharging switch 54A is in the on state is made lower than the impedance of the second discharging path Ldis2 when the second discharging switch 54B is in the on state. Thus, the discharging speed of the gate of the first switch SW1 is made higher than the discharging speed of the gate of the second switch SW2. This increases the switching speed when the first switch SW1 is switched to the off state. As a result, the switching loss is reduced.

Fifth Embodiment

Figure 17:
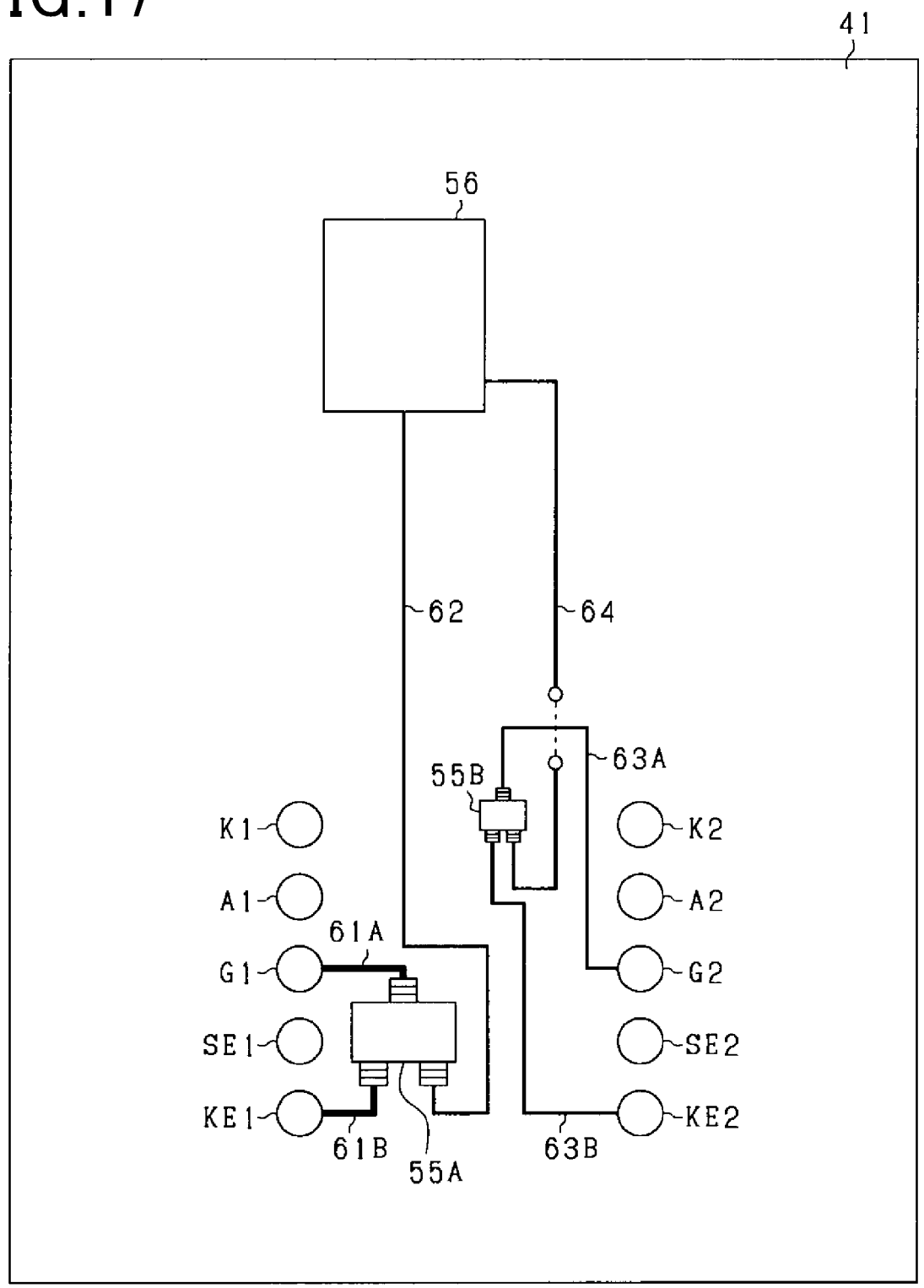
FIG. 17 is a plan view illustrating part of a control substrate according to a fifth embodiment.

Hereinafter, a fifth embodiment will be described with reference to the drawings focusing on the differences from the first embodiment. In the present embodiment, as shown in FIG. 17, an on-resistance RonA of the first off-holding switch 55A is smaller than an on-resistance RonB of the second off-holding switch 55B. Thus, the impedance of the first off-holding path Loff1 is made lower than the impedance of the second off-holding path Loff2. In FIG. 17, for purpose of illustration, the components that are the same as the components shown in FIG. 10 are given the same reference numerals. In the example shown in FIG. 17, the first off-holding switch 55A is greater than the second off-holding switch 55B. This is because, in general, the greater the chip size of the element, the smaller the on-resistance.

Sixth Embodiment

Figure 18:
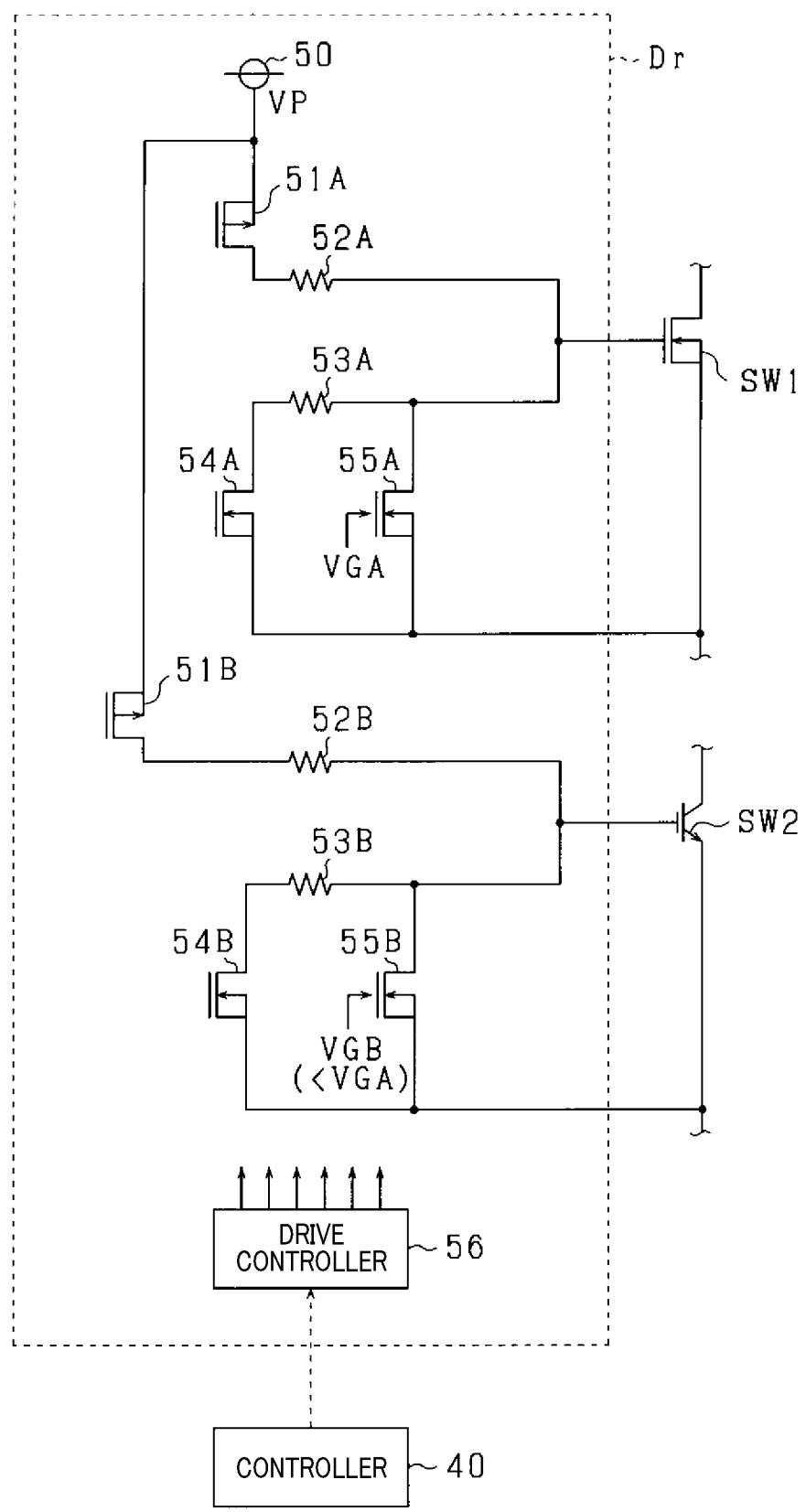
FIG. 18 is a diagram illustrating a drive circuit according to a sixth embodiment.

Hereinafter, a sixth embodiment will be described with reference to the drawings focusing on the differences from the first embodiment. In the present embodiment, as shown in FIG. 18, a gate voltage VGA of the first off-holding switch 55A for switching into the on state is higher than the gate voltage VGB of the second off-holding switch 55B for switching into the on state. The gate voltage VGA of the first off-holding switch 55A is greater than or equal to its threshold voltage, and the gate voltage VGB of the second off-holding switch 55B is greater than or equal to its threshold voltage. The first off-holding switch 55A corresponds to a low-side switch, and the second off-holding switch 55B corresponds to a high-side switch. In FIG. 18, for purpose of illustration, the components that are the same as the components shown in FIG. 6 are given the same reference numerals.

According to the present embodiment, the on-resistance of the first off-holding switch 55A is lower than the on-resistance of the second off-holding switch 55B. Thus, the impedance of the first off-holding path Loff1 is made lower than the impedance of the second off-holding path Loff2.

As long as the impedance of the first off-holding path Loff1 is made lower than the impedance of the second off-holding path Loff2, the length of the wiring pattern of the first off-holding path Loff1 does not necessarily have to be shorter than the length of the wiring pattern of the second off-holding path Loff2, or the width of the wiring pattern of the first off-holding path Loff1 does not necessarily have to be greater than the width of the wiring pattern of the second off-holding path Loff2.

Seventh Embodiment

Hereinafter, a seventh embodiment will be described with reference to the drawings focusing on the differences from the first embodiment. In the present embodiment, the drive control section 56 switches the second switch SW2 into the on state and then switches the first switch SW1 into the on state. Subsequently, the drive control section 56 switches the first switch SW1 into the off state and then switches the second switch SW2 into the off state. This is for inhibiting the decrease in the reliability of the first switch SW1 as much as possible in a case in which an arm short-circuit occurs. In the arm short-circuit, the upper and lower arm switches of the inverter 20 are simultaneously brought into the on state. That is, the maximum value of the collector current Ice that is permitted to flow through the second switch SW2 is greater than the maximum value of the drain current Ids that is permitted to flow through the first switch SW1. After the second switch SW2 is switched to the on state, if the short-circuit is detected before the first switch SW1 is switched to the on state, the second switch SW2 is prohibited from being switched to the on state. At this time, since the maximum value of the collector current Ice that is permitted to flow through the second switch SW2 is relatively great, the time given for detecting the short-circuit is sufficient.

Figure 19:
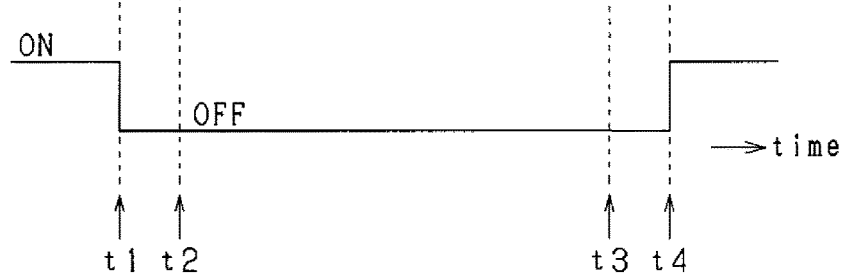
FIG. 19($a$), FIG. 19($b$), FIG. 19($c$), and FIG. 19($d$) are timing charts showing how first and second switches and first and second off-holding switches according to a seventh embodiment are driven.

The advantages of the present embodiment will be described with reference to FIG. 19. FIG. 19(a) shows the changes in the driving state of the first switch SW1, FIG. 19(b) shows the changes in the driving state of the second switch SW2, FIG. 19(c) shows the changes in the driving state of the first off-holding switch 55A, and FIG. 19(d) shows the changes in the driving state of the second off-holding switch 55B.

At a point in time t1, the second charging switch 51B is brought into the on state, and the second discharging switch 54B and the second off-holding switch 55B are brought into the off state. This switches the second switch SW2 to the on state. When the second switch SW2 is switched to the on state, the electric charge flows into the gate of the first switch SW1. This may possibly cause the self-turn-on of the first switch SW1, which has a relatively low threshold voltage. In the present embodiment, the impedance of the first off-holding path Loff1 is set lower than the impedance of the second off-holding path Loff2. This inhibits the increase in the gate voltage Vgs that is otherwise caused by switching the second switch SW2 to the on state and thus inhibits the occurrence of the self-turn-on.

Subsequently, at a point in time t2, the first charging switch 51A is brought into the on state, and the first discharging switch 54A and the first off-holding switch 55A are brought into the off state. This switches the first switch SW1 to the on state.

Subsequently, at a point in time t3, the first charging switch 51A is brought into the off state, and the first discharging switch 54A is brought into the on state. Thus, the gate voltage Vgs of the first switch SW1 becomes less than the threshold voltage Vth1, so that the first switch SW1 is switched to the off state. Additionally, the gate voltage Vgs of the first switch SW1 becomes less than or equal to the first specified voltage, and the first off-holding switch 55A is brought into the on state.

Subsequently, at a point in time t4, the second charging switch 51B is brought into the off state, and the second discharging switch 54B is brought into the on state. Thus, the gate voltage Vge of the second switch SW2 becomes less than the threshold voltage Vth2, and the second switch SW2 is switched to the off state. Additionally, the gate voltage Vge of the second switch SW2 becomes less than or equal to the second specified voltage, and the second off-holding switch 55B is brought into the on state. When the second switch SW2 is switched to the off state, the electric charge flows into the gate of the first switch SW1. This may possibly cause the self-turn-on of the first switch SW1, which has a relatively low threshold voltage. In the present embodiment, the impedance of the first off-holding path Loff1 is set lower than the impedance of the second off-holding path Loff2. This inhibits the increase in the gate voltage Vgs caused when the second switch SW2 is switched to the off state, and thus inhibits the occurrence of the self-turn-on.

Eighth Embodiment

Figure 20:
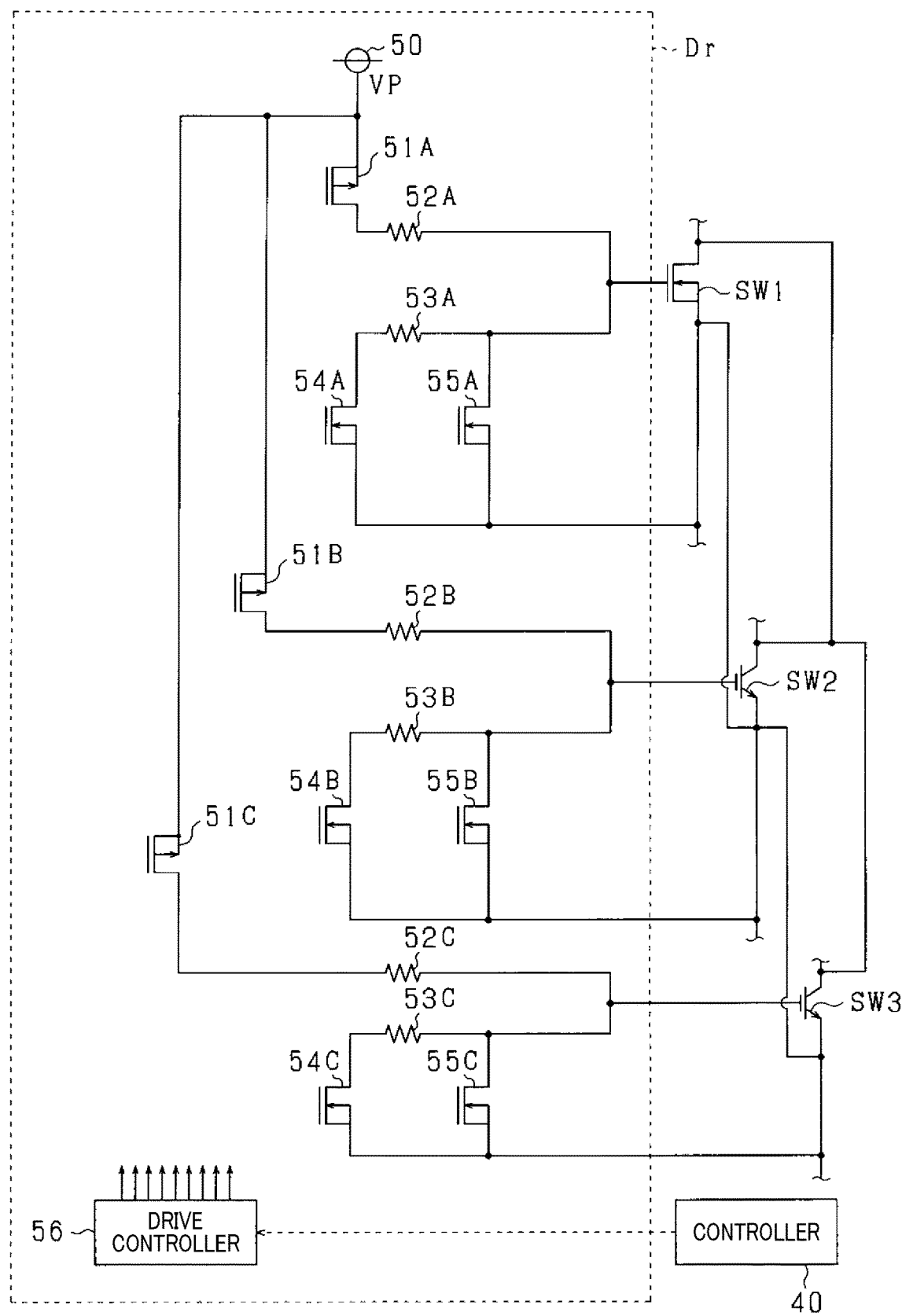
FIG. 20 is a diagram illustrating the configuration of a drive circuit according to an eighth embodiment.

Hereinafter, an eighth embodiment will be described with reference to the drawings focusing on the differences from the first embodiment. In the present embodiment, as shown in FIG. 20, the upper and lower arm switch sections 20H and 20L of the inverter 20 each include a parallel-connected assembly of first to third switches SW1 to SW3. In FIG. 20, for purpose of illustration, the components that are the same as the components shown in FIG. 6 are given the same reference numerals.

The third switch SW3 is an IGBT that has the same properties as the second switch SW2. A threshold voltage Vth3 of the third switch SW3 is the same as the threshold voltage Vth2 of the second switch SW2. The drive circuit Dr includes a third charging switch 51C, a first charging resistance 52C, a third discharging resistance 53C, a third discharging switch 54C, and a third off-holding switch 55C.

In the present embodiment, an electrical path from the gate of the third switch SW3 to the drain of the third off-holding switch 55C, the section between the drain and the source of the third off-holding switch 55C, and an electrical path from the source of the third off-holding switch 55C to the source of the third switch SW3 constitute a third off-holding path Loff3 corresponding to the third switch SW3.

In the present embodiment, the impedance of the second off-holding path Loff2 and the impedance of the third off-holding path Loff3 are the same. Additionally, the impedance of the first off-holding path Loff1 is set lower than the impedance of the second and third off-holding paths Loff2 and Loff3.

The present embodiment described above provides the same advantages as the first embodiment.

Modification 1 of Eighth Embodiment

On condition that the impedance of the first off-holding path Loff1 is set lower than the impedance of the second and third off-holding paths Loff2 and Loff3, the impedance of the second off-holding path Loff2 may different from the impedance of the third off-holding path Loff3.

Modification 2 of Eighth Embodiment

The threshold voltages Vth1 to Vth3 of the first to third switches SW1 to SW3 may different from one another. Hereinafter, a case in which the threshold voltage Vth1 of the first switch SW1 is lower than the threshold voltage Vth2 of the second switch SW2, and the threshold voltage Vth2 of the second switch SW2 is lower than the threshold voltage Vth3 of the third switch SW3 will be described as an example.

The impedance of the first off-holding path Loff1 may be set lower than the impedance of the second off-holding path Loff2, and the impedance of the second off-holding path Loff2 may be set lower than the impedance of the third off-holding path Loff3.

Moreover, on condition that the impedance of the first off-holding path Loff1 is set lower than the impedance of the second and third off-holding paths Loff2 and Loff3, the impedance of the second off-holding path Loff2 may be the same as the impedance of the third off-holding path Loff3, or may different from the impedance of the third off-holding path Loff3.

Ninth Embodiment

Figure 21:
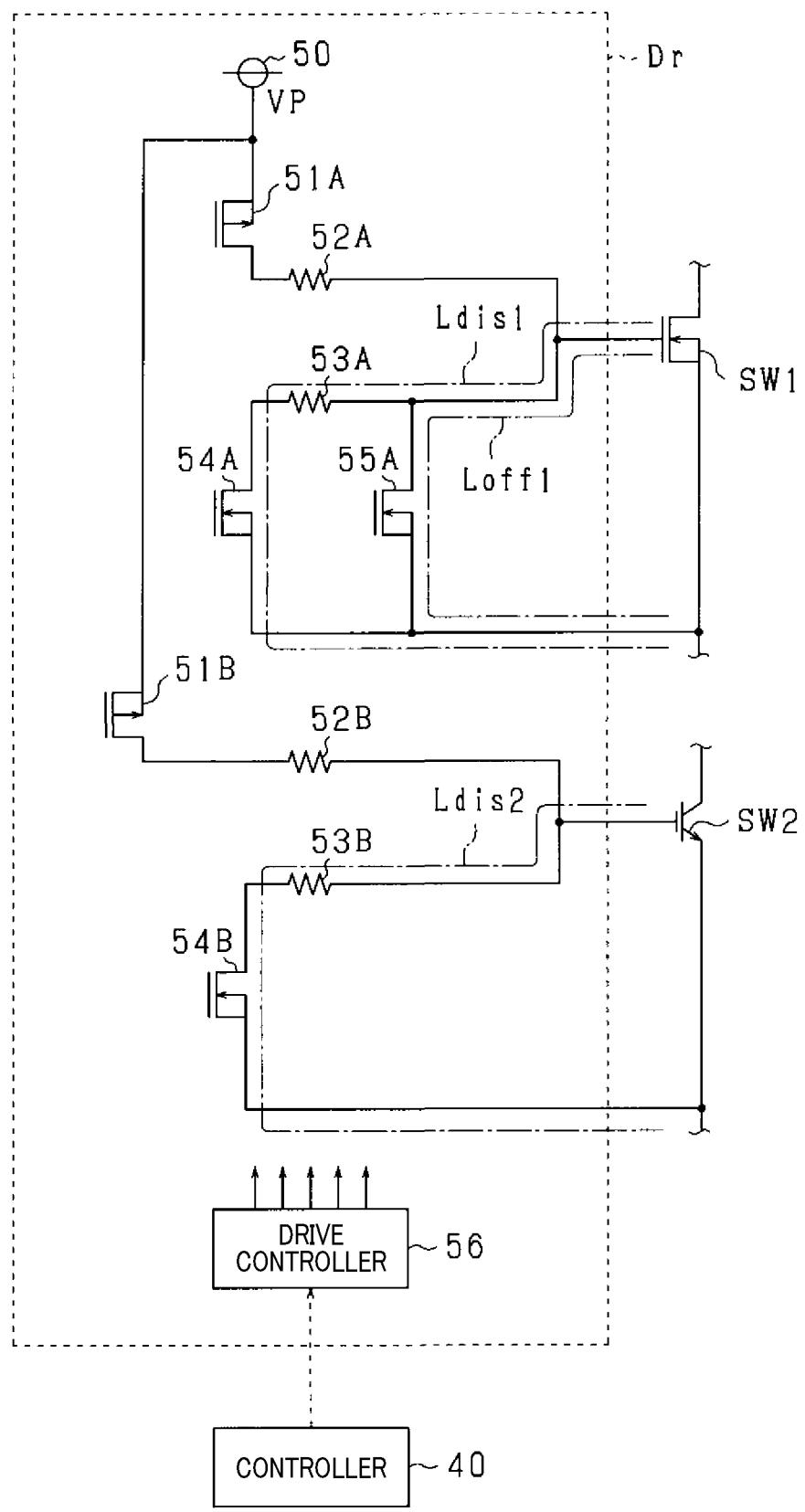
FIG. 21 is a diagram illustrating the configuration of a drive circuit according to a ninth embodiment.

Hereinafter, a ninth embodiment will be described with reference to the drawings focusing on the differences from the first embodiment. In the present embodiment, as shown in FIG. 21, the second off-holding path Loff2 corresponding to the second switch SW2, which has a relatively high threshold voltage, is not provided in the drive circuit Dr. In FIG. 21, for purpose of illustration, the components that are the same as the components shown in FIG. 6 are given the same reference numerals.

According to the present embodiment, the impedance of the first off-holding path Loff1 corresponding to the first switch SW1, which has a relatively low threshold voltage, is set lower than the impedance of the second discharging path Ldis2 corresponding to the second switch SW2, which has a relatively high threshold voltage. More specifically, the impedance of the first off-holding path Loff1 when the drive command of the first switch SW1 is the off command, and the first off-holding switch 55A is in the on state is set lower than the impedance of the second discharging path Ldis2 when the drive command of the second switch SW2 is the off command, and the second discharging switch 54B is in the on state.

Other Embodiments

Each of the above-described embodiments may be modified as follows.

Figure 22:
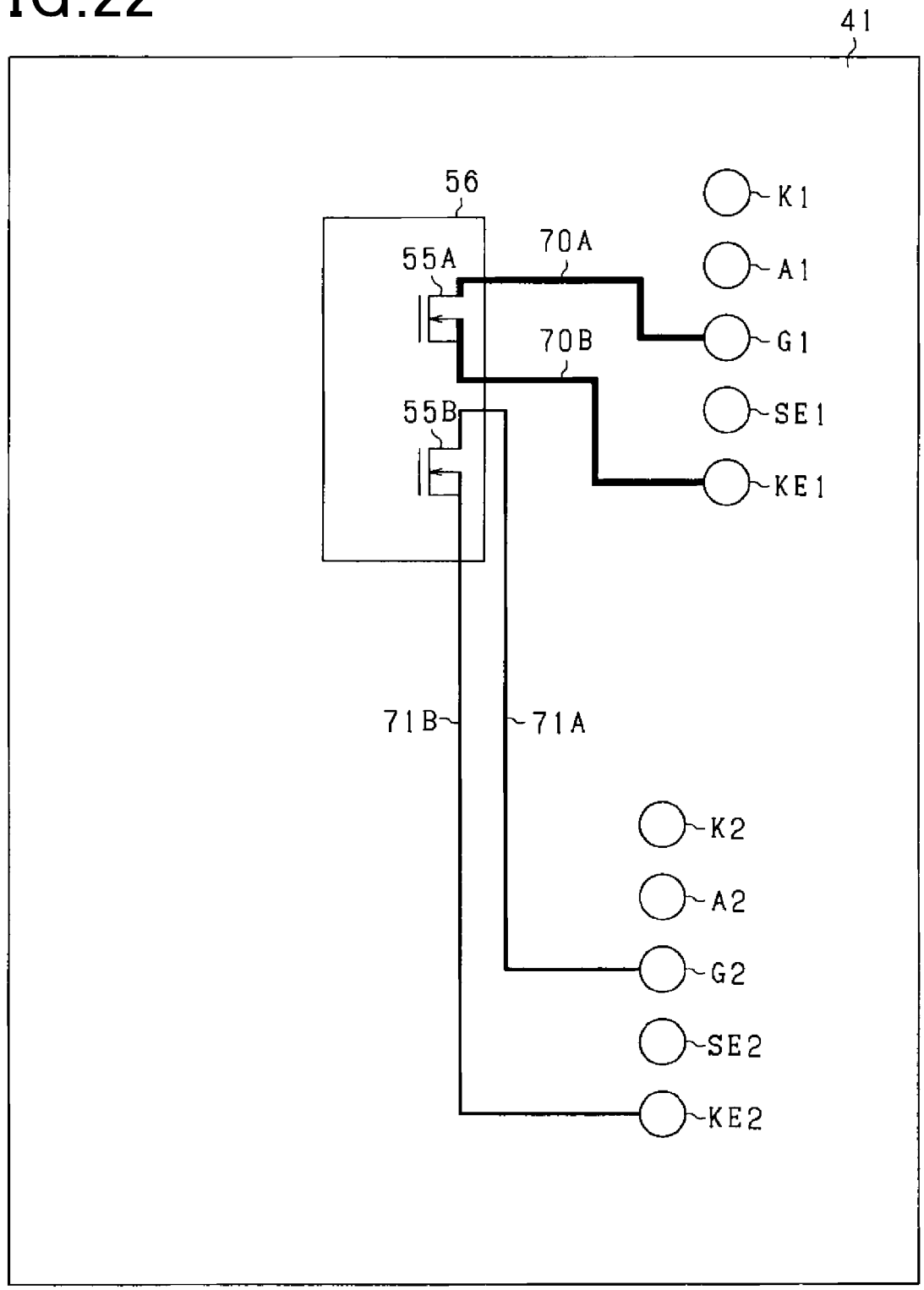
FIG. 22 is a plan view illustrating part of a control substrate according to another embodiment.

As shown in FIG. 22, the terminals K1, A1, G1, SE1, and KE1 of the first module 101 and the terminals K2, A2, G2, SE2, and KE2 of the second module 102 may be generally aligned in the second direction.

The order in which the terminals K1, A1, G1, SE1, and KE1 of the first module 101 are arranged and the order in which the terminals K2, A2, G2, SE2, and KE2 of the second module 102 are arranged are not limited to the order shown in, for example, FIGS. 10 and 22.

The drive control section may be provided separately for each of the first and second switches SW1 and SW2.

The off-holding switches and the drive control section do not necessarily have to be provided on the control substrate 41. At least one of the first and second modules 101 and 102 may include the off-holding switches and the drive control section. In this case, since the off-holding switches and the drive control section are close to the first switch SW1 or the second switch SW2, the impedance of the off-holding paths is further reduced.

Figure 23:
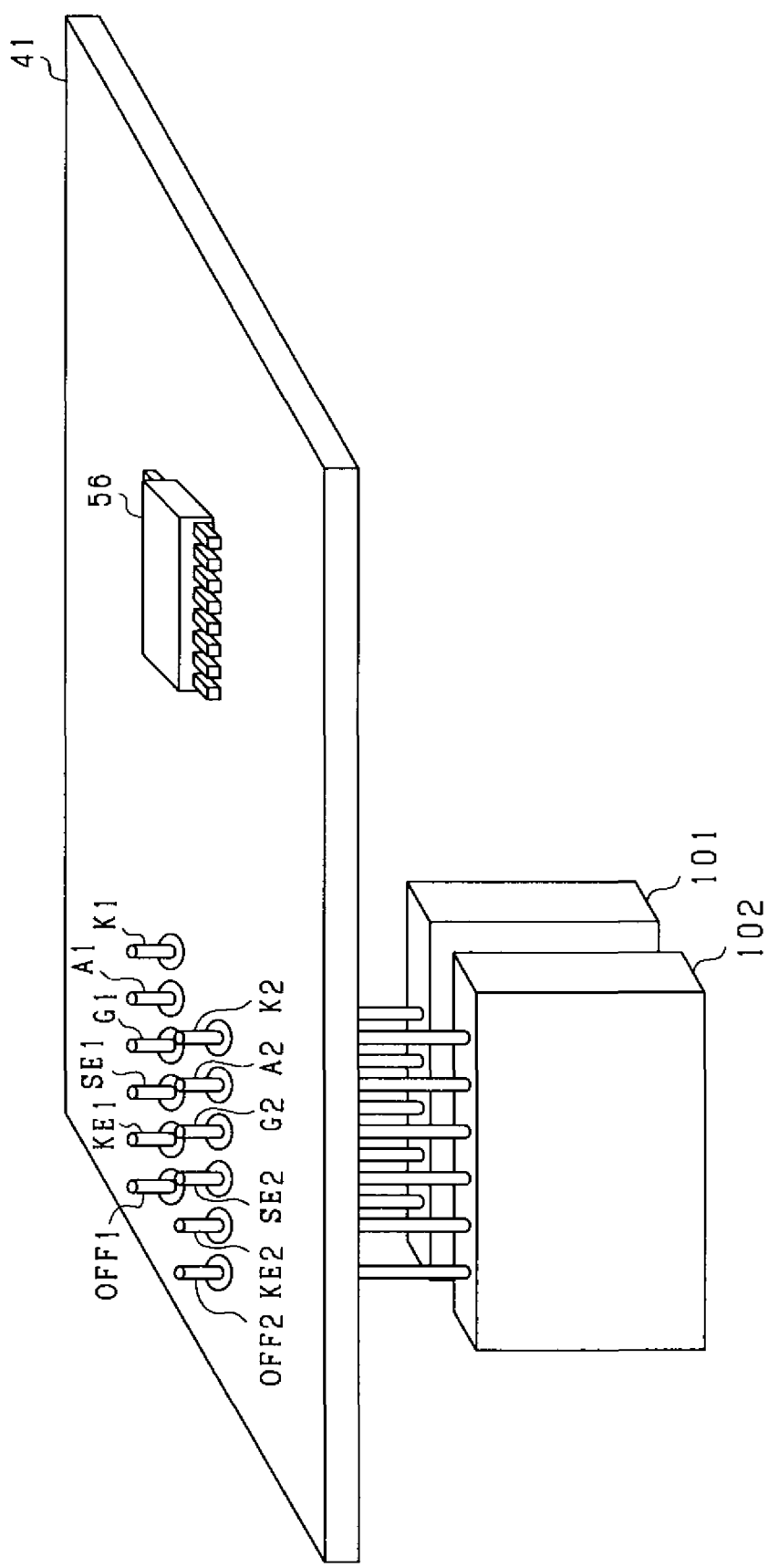
FIG. 23 is a perspective view illustrating part of the configuration of an inverter according to yet another embodiment.

Alternatively, as shown in FIG. 23, out of the off-holding switches and the drive control sections, only the off-holding switches need to be included in the modules. When at least the off-holding switches are included in the modules, first and second off-holding terminals OFF1 and OFF2, which are short-circuited to the gates of the first and second off-holding switches 55A and 55B, project from the main bodies of the first and second modules 101 and 102. The off-holding terminals OFF1 and OFF2 are electrically and mechanically connected to the control substrate 41. In this case, since the first and second off-holding switches 55A and 55B are close to the first and second switches SW1 and SW2, the impedance of the off-holding paths is further reduced.

The off-holding switch corresponding to only one of the first and second switches SW1 and SW2 may be included in the module.

Figure 24:
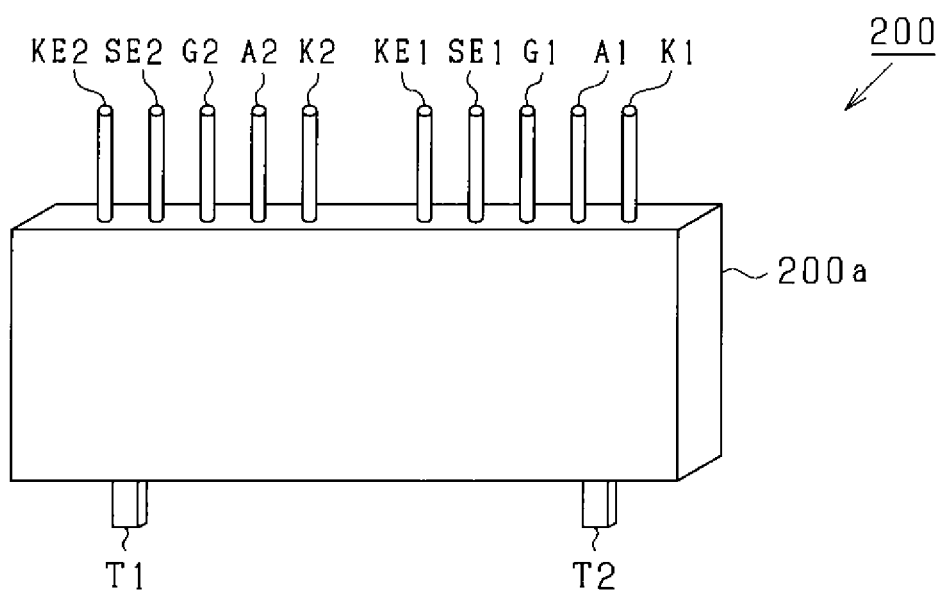
FIG. 24 is a perspective view of a module according to still another embodiment.

The module does not necessarily have to include one switch, but may include multiple switches that are connected in parallel with one another. FIG. 24 shows an example in which the first and second switches SW1 and SW2 are included in a single module 200. First and second power terminals T1 and T2 project from a main body 200$a$ of the module 200.

The combination of the switches included in the module is not limited to the first and second switches SW1 and SW2, which are connected in parallel with each other. For example, the first switches SW1 of the upper and lower arm switch sections 20H and 20L of the same phase may be included in a single module, or the second switches SW2 of the upper and lower arm switch sections 20H and 20L of the same phase may be included in a single module.

The structure including the negative voltage supply 57 shown in FIG. 11 can be applied to the embodiments other than the first embodiment.

The number of the parallel-connected switches may be four or more.

The combination of the parallel-connected switches is not limited to the combination of the N-channel MOSFET and the IGBT. The power converter including the switches is not limited to a three-phase power converter.

Although the present disclosure has been described in accordance with the embodiments, it is understood that the present disclosure is not limited to the embodiments and the configurations. The present disclosure embraces various modifications and deformations that come within the range of equivalency. Additionally, various combinations and forms, or other combinations and forms including only one or more additional elements, or less than all elements are included in the scope and ideas obtainable from the present disclosure.

What is claimed is:

1. A drive circuit for driven switches, wherein the drive circuit drives a plurality of driven switches that are connected in parallel with one another, comprising:

the driven switches each include a first main terminal, a second main terminal, and a main control terminal, when a potential difference of the main control terminal with respect to the second main terminal becomes greater than or equal to a threshold voltage, the switch is brought into an on state, in which the flow of current between the first main terminal and the second main terminal is permitted, and when the potential difference becomes less than the threshold voltage, the switch is brought into an off state, in which the flow of current from the first main terminal to the second main terminal is prevented, the threshold voltages of at least two of the driven switches are different from each other, each of the driven switches is at an electrical path, which electrically connects the second main terminal or a negative voltage supply, which is at a negative voltage lower than the potential of the second main terminal, to the main control terminal, the impedance of each of the electrical paths is set so that the potential difference increased by electric charge flowing into the electrical path through a parasitic capacitance of the driven switch becomes less than the threshold voltage, and the impedance of the electrical path connected to the main control terminal of the driven switch that includes the lowest threshold voltage among the driven switches is set lower than the impedance of the electrical path connected to the main control terminal of another driven switch.

2. The drive circuit for the driven switches according to claim 1, wherein the electrical path includes an off-holding path, which short-circuits the second main terminal or the negative voltage supply to the main control terminal, each off-holding path includes an off-holding switch, which electrically connects the second main terminal or the negative voltage supply to the main control terminal when the off-holding switch is brought into the on state and electrically interrupts the connection between the second main terminal or the negative voltage supply and the main control terminal when the off-holding switch is brought into the off state, and the distance between the main control terminal of the driven switch having the lowest threshold voltage among the driven switches and the off-holding switch on the off-holding path connected to this main control terminal is shorter than the distance between the main control terminal of at least one other driven switch and the off-holding switch on the off-holding path connected to this main control terminal.

3. The drive circuit for the driven switches according to claim 2, wherein the drive circuit includes a drive control section, which drives the off-holding switch on each off-holding path, wherein the off-holding switch on the off-holding path connected to the main control terminal of the driven switch having the lowest threshold voltage is located outside the drive control section, and the off-holding switch on the off-holding path connected to the main control terminal of another driven switch is included in the drive control section.

4. The drive circuit for the driven switches according to claim 2, wherein
the drive circuit includes a drive control section, which drives the off-holding switch on each off-holding path, wherein
the off-holding switches are included in the drive control section, and
the distance between the main control terminal of the driven switch having the lowest threshold voltage and the drive control section is shorter than the distance between the main control terminal of at least one other driven switch and the drive control section.

5. The drive circuit for the driven switches according to claim 1, wherein
the electrical paths include:
an off-holding path, which short-circuits the second main terminal or the negative voltage supply to the main control terminal, and
a discharging path, which connects the second main terminal or the negative voltage supply to the main control terminal and includes an impedance higher than the impedance of the off-holding path, wherein
each off-holding path includes an off-holding switch, which electrically connects the second main terminal or the negative voltage supply to the main control terminal when the off-holding switch is brought into the on state and electrically interrupts the connection between the second main terminal or the negative voltage supply and the main control terminal when the off-holding switch is brought into the off state,
the drive circuit for the driven switches further includes a drive control section, which drives the off-holding switch on each off-holding path, wherein
the off-holding switch on the off-holding path connected to the main control terminal of the driven switch having the lowest threshold voltage is included in the drive control section, and the off-holding switch on the off-holding path connected to the main control terminal of another driven switch is located outside the drive control section,
the distance between the main control terminal of the driven switch having the lowest threshold voltage and the drive control section is shorter than the distance between the main control terminal of at least one other driven switch and the drive control section, and
the impedance of the discharging path (Ldis1) connected to the main control terminal of the above-mentioned lowest driven switch is set lower than the impedance of the discharging path connected to the main control terminal of another driven switch.

6. The drive circuit for the driven switches according to claim 1, wherein
the electrical path includes an off-holding path, which short-circuits the second main terminal or the negative voltage supply to the main control terminal,
each off-holding path includes an off-holding switch, which electrically connects the second main terminal or the negative voltage supply to the main control terminal when the off-holding switch is brought into the on state and electrically interrupts the connection between the second main terminal or the negative voltage supply and the main control terminal when the off-holding switch is brought into the off state, and the off-holding switch on the off-holding path connected to the main control terminal of the driven switch having the lowest threshold voltage among the driven switches is at an on-resistance smaller than the on-resistance of the off-holding switch on the off-holding path connected to the main control terminal of another driven switch.

7. The drive circuit for the driven switches according to claim 1, wherein
the electrical path includes an off-holding path, which short-circuits the second main terminal or the negative voltage supply to the main control terminal,
each off-holding path includes an off-holding switch, which electrically connects the second main terminal or the negative voltage supply to the main control terminal when the off-holding switch is brought into the on state and electrically interrupts the connection between the second main terminal or the negative voltage supply and the main control terminal when the off-holding switch is brought into the off state, and
when the off-holding switch on the off-holding path connected to the main control terminal of the driven switch having the lowest threshold voltage among the driven switches is referred to as a low-side switch, and the off-holding switch on the off-holding path connected to the main control terminal of another driven switch is referred to as a high-side switch, the gate voltage of the low-side switch in the on state is higher than the gate voltage of the high-side switch in the on state.

8. The drive circuit for the driven switches according to claim 1, wherein
the drive circuit includes a drive control section, wherein
among the driven switches, when the driven switch with a property in which the on-resistance becomes minimum in a small-current region smaller than a predetermined current is referred to as a first switch, and the driven switch with a property in which the on-resistance becomes minimum in a great-current region greater than or equal to the predetermined current is referred to as a second switch, the drive control section switches the second switch to the on state first and then switches the first switch to the on state, and
among the driven switches, the driven switch having the lowest threshold voltage is the second switch, and the other driven switch is the first switch.

9. The drive circuit for the driven switches according to claim 1, wherein
the drive circuit includes a drive control section, wherein
among the driven switches, when the driven switch with a property in which the on-resistance becomes minimum in a small-current region smaller than a predetermined current is referred to as a first switch, and the driven switch with a property in which the on-resistance becomes minimum in a great-current region greater than or equal to the predetermined current is referred to as a second switch, the drive control section switches the first switch to the off state first and then switches the second switch to the off state, and
among the driven switches, the driven switch having the lowest threshold voltage is the second switch, and the other driven switch is the first switch.

10. The drive circuit for the driven switches according to claim 1, wherein
the electrical path connected to the main control terminal of the driven switch having the lowest threshold voltage among the driven switches is at an off-holding path, which short-circuits the second main terminal or the negative voltage supply to the main control terminal, and the electrical path connected to the main control terminal of another driven switch includes a discharging path, which connects the second main terminal or the negative voltage supply to the main control terminal and includes an impedance higher than the impedance of the off-holding path, and includes no off-holding path.

* * * * *